United States Patent
Kim et al.

(10) Patent No.: US 8,406,029 B2
(45) Date of Patent: Mar. 26, 2013

(54) IDENTIFICATION OF DATA POSITIONS IN MAGNETIC PACKET MEMORY STORAGE DEVICES, MEMORY SYSTEMS INCLUDING SUCH DEVICES, AND METHODS OF CONTROLLING SUCH DEVICES

(75) Inventors: Ho-jung Kim, Suwon-si (KR);
Chul-woo Park, Yongin-si (KR);
Sang-beom Kang, Hwaseong-si (KR);
Jong-wan Kim, Seongnam-si (KR);
Hyun-ho Choi, Suwon-si (KR);
Young-pil Kim, Hwaseong-si (KR);
Sung-chul Lee, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 524 days.

(21) Appl. No.: 12/658,859

(22) Filed: Feb. 16, 2010

(65) Prior Publication Data

US 2010/0208504 A1   Aug. 19, 2010

(30) Foreign Application Priority Data

Feb. 17, 2009   (KR) .................. 10-2009-0013136
Mar. 3, 2009    (KR) .................. 10-2009-0018126

(51) Int. Cl.
   *G11C 19/00*   (2006.01)
(52) U.S. Cl. ................. 365/80; 365/85; 365/87
(58) Field of Classification Search ............... 365/80 O, 365/85 X, 87 X, 158, 173, 80, 85, 87
See application file for complete search history.

(56) References Cited

U.S. PATENT DOCUMENTS

| | | | |
|---|---|---|---|
| 3,369,225 A * | 2/1968 | Fuller | ............... 365/87 |
| 6,781,871 B2 | 8/2004 | Park et al. | |
| 6,834,005 B1 | 12/2004 | Parkin | |
| 6,849,891 B1 | 2/2005 | Hsu et al. | |
| 6,898,132 B2 | 5/2005 | Parkin | |
| 6,920,062 B2 | 7/2005 | Parkin | |
| 6,955,926 B2 | 10/2005 | Chen et al. | |
| 6,970,379 B2 | 11/2005 | Parkin | |
| 7,031,178 B2 | 4/2006 | Parkin | |
| 7,108,797 B2 | 9/2006 | Chen et al. | |
| 7,218,556 B2 | 5/2007 | Kim et al. | |
| 7,236,386 B2 | 6/2007 | Parkin | |
| 7,242,604 B2 | 7/2007 | Klaeui et al. | |
| 7,282,759 B2 | 10/2007 | Kim et al. | |
| 7,315,470 B2 | 1/2008 | Parkin | |
| 7,477,539 B2 | 1/2009 | Kim et al. | |
| 7,855,908 B2 * | 12/2010 | Joe et al. | ............... 365/85 |
| 7,859,881 B2 * | 12/2010 | Iwata et al. | ............... 365/81 |
| 2007/0158736 A1 | 7/2007 | Arai et al. | |
| 2007/0194359 A1 | 8/2007 | Lim et al. | |
| 2007/0195587 A1 | 8/2007 | Kim et al. | |
| 2007/0195588 A1 | 8/2007 | Kim et al. | |
| 2007/0198618 A1 | 8/2007 | Kim et al. | |
| 2008/0025060 A1 | 1/2008 | Lim et al. | |
| 2008/0068880 A1 | 3/2008 | Lim et al. | |
| 2008/0068881 A1 | 3/2008 | Lim et al. | |

(Continued)

*Primary Examiner* — VanThu Nguyen
(74) *Attorney, Agent, or Firm* — Onello & Mello, LLP

(57) ABSTRACT

In a memory device and in a method for controlling a memory device, the memory device comprises a magnetic structure that stores information in a plurality of domains of the magnetic structure. A read unit reads information from at least one of the plurality of domains of the magnetic structure by applying a read current to the magnetic structure. A position detector unit compares the information read by a read current from the read unit from multiple domains of the plurality of domains of the magnetic structure to identify the presence of an expected information pattern at select domains of the plurality of domains.

19 Claims, 21 Drawing Sheets

U.S. PATENT DOCUMENTS

| | | |
|---|---|---|
| 2008/0068936 A1 | 3/2008 | Lim et al. |
| 2008/0080092 A1 | 4/2008 | Kim |
| 2008/0094760 A1 | 4/2008 | Lee et al. |
| 2008/0094887 A1 | 4/2008 | Hwang et al. |
| 2008/0100963 A1 | 5/2008 | Lee et al. |
| 2008/0124578 A1 | 5/2008 | Kim et al. |
| 2008/0137389 A1 | 6/2008 | Hwang et al. |
| 2008/0137395 A1 | 6/2008 | Hwang et al. |
| 2008/0137406 A1 | 6/2008 | Lim et al. |
| 2008/0137521 A1 | 6/2008 | Lee et al. |
| 2008/0138659 A1 | 6/2008 | Lim et al. |
| 2008/0138661 A1 | 6/2008 | Lim et al. |
| 2008/0152794 A1 | 6/2008 | Lim et al. |
| 2008/0152953 A1 | 6/2008 | Lim |
| 2008/0152954 A1 | 6/2008 | Lim |
| 2008/0158710 A1 | 7/2008 | Lim |
| 2008/0160349 A1 | 7/2008 | Lim |
| 2008/0173932 A1 | 7/2008 | Kidoh et al. |
| 2009/0040883 A1 | 2/2009 | Kim et al. |

\* cited by examiner

IDENTIFICATION OF DATA POSITIONS IN MAGNETIC PACKET MEMORY STORAGE DEVICES, MEMORY SYSTEMS INCLUDING SUCH DEVICES, AND METHODS OF CONTROLLING SUCH DEVICES

RELATED APPLICATIONS

This application claims priority under 35 U.S.C. 119 to Korean Patent Application No. 10-2009-0013136, filed on Feb. 17, 2009 and Korean Patent Application No. 10-2009-0018126, filed on Mar. 3, 2009, the content of each being incorporated herein by reference in its entirety.

BACKGROUND

With the continued emphasis on highly integrated electronic devices, there is an ongoing need for semiconductor memory devices that operate at higher speed and lower power and that have increased device density. To accomplish this, devices with aggressive scaling and multiple-layered devices with transistor cells arranged in horizontal and vertical arrays have been under development.

In recent years, there has been development in the field of magnetic packet memory storage devices. In such devices, a magnetic structure, or "magnetic track", is defined to include a series of physical domain regions. The magnetic structure is formed, for example, of ferromagnetic material so that it can store data in the form of magnetic fields having predefined orientations. Such devices are generally experimental in nature.

SUMMARY

Systems and methods in accordance with embodiments disclosed herein provide a mechanism by which the position of real data stored on a magnetic track can be determined. Such a determination is made without the need for a counter or pointer, which can be complex in nature and therefore would otherwise consume valuable circuit area of the semiconductor circuit. Instead, the determination is made using a simplified logic operation that draws a comparison between read data, that is, data read from domains of the magnetic track by a read unit, and a known data identification pattern. Data can be read from a single set of adjacent domains or from multiple sets of adjacent domains of the track in making the comparison. The systems and methods disclosed herein can be applied, for example, after a sudden power failure where information pertaining to the position of the real data can be lost.

Systems and methods in accordance with embodiments disclosed herein further provide a mechanism by which an optimal value of a domain wall moving current used for shifting data elements between domains of a magnetic track, is determined by storing a calibration data element on the magnetic track and by optimizing the domain wall moving current based on the calibration data element. In one embodiment, the optimal pulse width of the domain wall moving current is determined. In another embodiment, the optimal magnitude of the domain wall moving current is determined. In this manner, efficient and accurate operation of the magnetic track can be ensured, despite variation in fabrication process and in operating conditions.

In one aspect, a memory device, comprises: a magnetic structure that stores information in a plurality of domains of the magnetic structure; a read unit that reads information from at least one of the plurality of domains of the magnetic structure by applying a read current to the magnetic structure; and a position detector unit that compares the information read by a read current from the read unit from multiple domains of the plurality of domains of the magnetic structure to identify the presence of an expected information pattern at select domains of the plurality of domains.

In one embodiment, the expected information pattern comprises: a first pattern; and a second pattern spaced apart from the first pattern by a number of domains of the plurality of domains of the magnetic structure.

In another embodiment, the read unit comprises multiple read units, the read units corresponding to domains that are spaced apart from each other by a number of domains that is approximately equal to the number of domains by which the second pattern is spaced apart from the first pattern.

In another embodiment, the second pattern is different than the first pattern.

In another embodiment, the second pattern comprises a plurality of second patterns that are spaced apart from each other by a number of domains of the plurality of domains of the magnetic structure and wherein the number of domains between each of the plurality of second patterns is the same.

In another embodiment, the first and second patterns comprise a toggling bit pattern of alternating "0" and "1" bits.

In another embodiment, the position detector unit comprises logic circuitry that performs a bitwise comparison of the information read by the read unit and the expected information pattern.

In another embodiment, the logic circuitry of the position detector unit comprises: a read data register that stores information read by the read unit; a reference register that stores the expected information pattern; and a logic circuit that compares the contents of the read data register and the reference register and that outputs a comparison result.

In another embodiment, the logic circuit of the position detector unit comprises: a read data register that stores information read by the read unit; and a logic circuit that compares the contents of the read data register and the expected information pattern, wherein the expected information pattern comprises a series of hard-wired bits determined during manufacturing, and that outputs a comparison result.

In another embodiment, the read unit comprises a single read unit.

In another embodiment, the read unit applies the read current in response to a read current control signal, and wherein the magnetic structure further comprises: a write unit that writes information to at least one of a plurality of domains of the magnetic structure by applying a write current to the magnetic structure in response to a write current control signal; and a domain wall movement control unit coupled to a portion of the magnetic structure that moves information stored in the plurality of domains in the magnetic structure to other domains in the magnetic structure in response to a domain wall movement control signal.

In another embodiment, the write unit and read unit are coupled to portions of the magnetic structure at domain positions that are at central regions of the magnetic structure.

In another embodiment, the write unit and read unit are coupled to portions of the magnetic structure at domain positions that are spaced apart from each other at opposite ends of the magnetic structure.

In another embodiment, the memory device further comprises: a memory decoder that generates a plurality of select signals in response to command and address signals received from a memory controller and that applies the select signals to selected signal lines; and a read current generator that applies the read current to the read unit, wherein the read unit reads information by applying the read current to the magnetic structure on the read current signal line in response to the select signal on a corresponding selected signal line.

In another aspect, in a method of controlling a memory device, the memory device comprises a magnetic structure that stores information in a plurality of domains of the magnetic structure. The method comprises: reading information from at least one of the plurality of domains of the magnetic structure by applying a read current to the magnetic structure at a read unit; and comparing the information read by the read unit from multiple domains of the plurality of domains of the magnetic structure to identify the presence of an expected information pattern at select domains of the plurality of domains.

In one embodiment, the identifying the presence of the expected information pattern comprises: identifying a first pattern; and identifying a second pattern spaced apart from the first pattern by a number of domains of the plurality of domains of the magnetic structure.

In another embodiment, reading information includes reading information from multiple read units, the read units corresponding to domains that are spaced apart from each other by a number of domains that is similar to the number of domains by which the second pattern is spaced apart from the first pattern.

In another embodiment, the second pattern is different than the first pattern.

In another embodiment, the second pattern comprises a plurality of second patterns that are spaced apart from each other by a number of domains of the plurality of domains of the magnetic structure and wherein the number of domains of spacing between each of the plurality of second patterns is the same.

In another embodiment, the first and second patterns comprise a toggling bit pattern of alternating "0" and "1" bits.

In another embodiment, comparing comprises performing a bitwise comparison of the information read by the read unit and the expected information pattern.

In another embodiment, the read unit comprises a single read unit.

In another embodiment, the read unit applies the read current in response to a read current control signal, and wherein magnetic structure further comprises: a write unit that writes information to at least one of a plurality of domains of the magnetic structure by applying a write current to the magnetic structure in response to a write current control signal; and a domain wall movement control unit coupled to a portion of the magnetic structure that moves information stored in the plurality of domains in the magnetic structure to other domains in the magnetic structure in response to a domain wall movement control signal.

In another embodiment, the write unit and read unit are coupled to portions of the magnetic structure at domain positions that are at central regions of the magnetic structure.

In another embodiment, the write unit and read unit are coupled to portions of the magnetic structure at domain positions that are spaced apart from each other at opposite ends of the magnetic structure.

In another aspect, a memory device comprises: a memory decoder that generates a plurality of select signals in response to command and address signals received from a memory controller and that applies the select signals to selected signal lines; a read current generator that applies a read current to a read current signal line; and a plurality of storage units. Each storage unit comprises: a magnetic structure that stores information in a plurality of domains of the magnetic structure; a read unit that reads information from at least one of the plurality of domains of the magnetic structure by applying a read current to the magnetic structure on the read current signal line in response to the select signal on a corresponding selected signal line; and a position detector unit that compares the information read by a read current from the read unit from multiple domains of the plurality of domains of the magnetic structure to identify the presence of an expected information pattern at select domains of the plurality of domains.

In one embodiment, the memory device further comprises: a write current generator that applies a write current to a write current signal line; and a domain wall movement current generator that applies a domain wall movement current to a domain wall movement current signal line, and wherein each storage unit further comprises: a write unit that writes information to at least one of the plurality of domains of the magnetic structure by applying the write current to the magnetic structure in response to the select signal on the corresponding selected signal line; and a domain wall movement control unit coupled to a portion of the magnetic structure that moves information stored in the plurality of domains in the magnetic structure to other domains in the magnetic structure by applying the domain wall movement current to the magnetic structure in response to the select signal on the corresponding selected signal line.

In another aspect, in a method of controlling a memory device, the memory device has a magnetic structure that stores information in a plurality of domains of the magnetic structure, the memory device including: a read unit that reads information from at least one of the plurality of domains of the magnetic structure by applying a read current to the magnetic structure; and a domain wall movement control unit coupled to a portion of the magnetic structure that moves information stored in the plurality of domains in the magnetic structure to other domains in the magnetic structure by applying a domain wall moving current pulse to the magnetic structure. The method comprises: providing the domain wall moving current pulse to the magnetic structure at the domain wall movement control unit; reading a calibration data element from the magnetic structure at the read unit; and modifying the domain wall moving current pulse in response to the read calibration data element.

In one embodiment, the memory device further comprises a write unit that writes information to at least one of a plurality of domains of the magnetic structure by applying a write current to the magnetic structure in response to a write current control signal.

In another embodiment, reading the calibration data element comprises monitoring a transitioning of values of bits of the calibration data element as a result of the providing domain wall moving current pulse to the magnetic structure.

In another embodiment, modifying further comprises increasing a duration of the domain wall moving current pulse if a number of transitions of the values of bits of the read calibration data element is less than a first number of transitions.

In another embodiment, modifying further comprises decreasing a duration of the domain wall moving current pulse if a number of transitions of the values of bits of the read calibration data element is greater than a second number of transitions.

In another embodiment, modifying further comprises increasing an amplitude of the domain wall moving current pulse if a number of transitions of the values of bits of the read calibration data element is less than a first number of transitions.

In another embodiment, modifying further comprises decreasing an amplitude of the domain wall moving current pulse if a number of transitions of the values of bits of the read calibration data element is greater than a second number of transitions.

In another embodiment, the method further comprises: providing the domain wall moving current pulse to the magnetic structure and reading a calibration data element from the magnetic structure at the read unit for a plurality of domain wall moving current pulses of varying at least one duration and amplitude; and determining a number a transitioning of values of bits of the calibration data element as a result of each providing of the domain wall moving current pulse, wherein modifying the domain wall moving current pulse in response to the read calibration data element is in response to multiple determinations of the number of transitions for multiple times of providing the domain wall moving current pulse to the magnetic structure.

In another embodiment, modifying is further in response to: a determination of first characteristics of a domain wall moving current pulse causing a single transition of the read calibration data element and a determination of second characteristics of the domain wall moving current pulse causing two transitions of the read calibration data element.

In another embodiment, the calibration data element comprises a toggling bit pattern of alternating bits of "0" and "1" values.

In another embodiment, modifying the domain wall moving current pulse comprises modifying a duration of the domain wall moving current pulse.

In another embodiment, modifying the domain wall moving current pulse comprises modifying a amplitude of the domain wall moving current pulse.

In another aspect, a memory device comprises: a magnetic structure that stores information in a plurality of domains of the magnetic structure; a read unit that reads information from at least one of the plurality of domains of the magnetic structure by applying a read current to the magnetic structure; a domain wall movement control unit coupled to a portion of the magnetic structure that moves information stored in the plurality of domains in the magnetic structure to other domains in the magnetic structure by applying a domain wall moving current pulse to the magnetic structure; and a controller that: provides the domain wall moving current pulse to the magnetic structure at the domain wall movement control unit; reads a calibration data element from the magnetic structure at the read unit in response to providing the domain wall moving current pulse to the magnetic structure; and modifies the domain wall moving current pulse in response to the read calibration data element.

In one embodiment, the memory device further comprises a write unit that writes information to at least one of a plurality of domains of the magnetic structure by applying a write current to the magnetic structure in response to a write current control signal.

In another embodiment, the controller reading the calibration data element comprises monitoring a transitioning of values of bits of the calibration data element as a result of the providing domain wall moving current pulse to the magnetic structure.

In another embodiment, the controller modifying the domain wall moving current pulse further comprises increasing a duration of the domain wall moving current pulse if a number of transitions of the values of bits of the read calibration data element is less than a first number of transitions.

In another embodiment, the controller modifying the domain wall moving current pulse further comprises decreasing a duration of the domain wall moving current pulse if a number of transitions of the values of bits of the read calibration data element is greater than a second number of transitions.

In another embodiment, the controller modifying the domain wall moving current pulse further comprises increasing an amplitude of the domain wall moving current pulse if a number of transitions of the values of bits of the read calibration data element is less than a first number of transitions.

In another embodiment, the controller modifying the domain wall moving current pulse further comprises decreasing an amplitude of the domain wall moving current pulse if a number of transitions of the values of bits of the read calibration data element is greater than a second number of transitions.

In another embodiment, the controller further: provides the domain wall moving current pulse to the magnetic structure and reads a calibration data element from the magnetic structure at the read unit for a plurality of domain wall moving current pulses of varying at least one duration and amplitude; and determines a number a transitioning of values of bits of the calibration data element as a result of each providing of the domain wall moving current pulse, wherein the controller modifying the domain wall moving current pulse in response to the read calibration data element is in response to multiple determinations of the number of transitions for multiple times of providing the domain wall moving current pulse to the magnetic structure.

In another embodiment, the controller modifying the domain wall moving current pulse is further in response to: a determination of first characteristics of a domain wall moving current pulse causing a single transition of the read calibration data element; and a determination of second characteristics of the domain wall moving current pulse causing two transitions of the read calibration data element.

In another embodiment, the calibration data element comprises a toggling bit pattern of alternating bits of "0" and "1" values.

In another embodiment, the controller modifying the domain wall moving current pulse comprises modifying a duration of the domain wall moving current pulse.

In another embodiment, the controller modifying the domain wall moving current pulse comprises modifying a amplitude of the domain wall moving current pulse.

In another embodiment, the memory device further comprises: a memory decoder that generates a plurality of select signals in response to command and address signals received from a memory controller and that applies the select signals to selected signal lines; and a read current generator that applies the read current to the read unit, wherein the read unit reads information by applying the read current to the magnetic structure on the read current signal line in response to the select signal on a corresponding selected signal line.

In another embodiment, the controller further operates to place the memory device in a wait mode while the controller is reading the calibration data element from the magnetic structure.

In another embodiment, the controller further operates to place the memory device in the wait mode when change in operating temperature of a predetermined amount is sensed.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Figure 1:
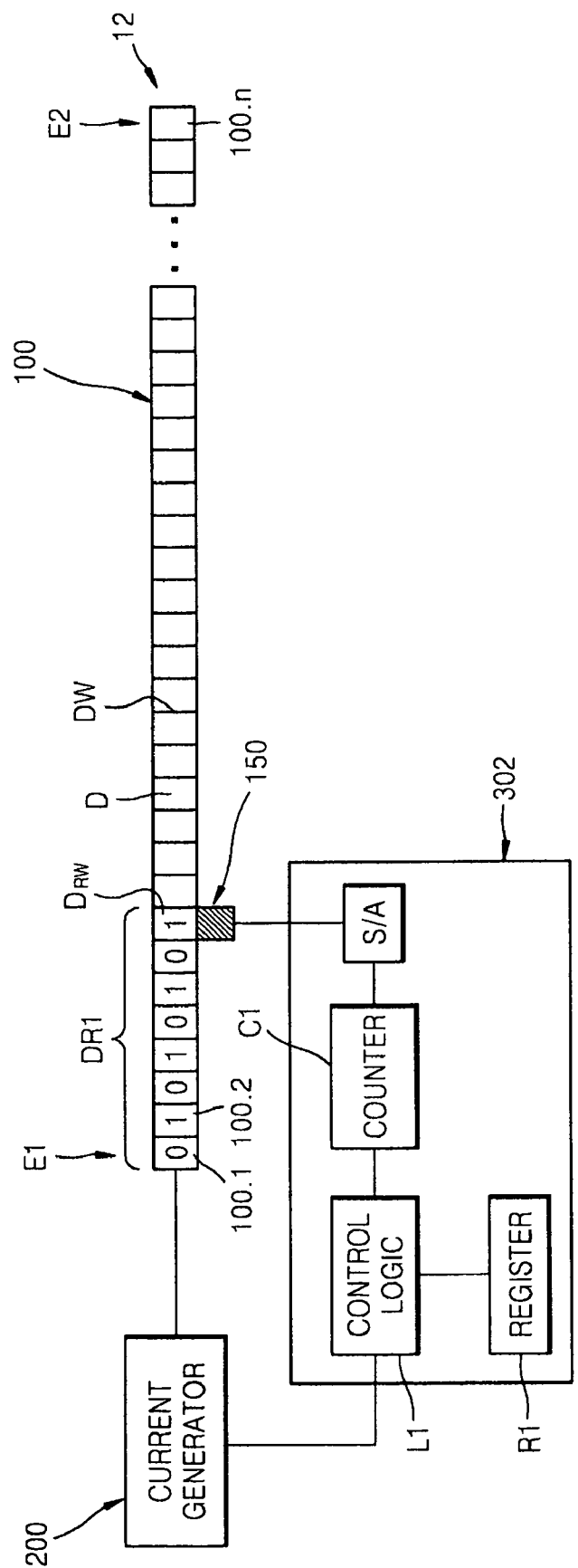
FIG. 1 is a schematic diagram of a magnetic track storage device, in accordance with an embodiment of the present invention.

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap. As mentioned above, the drawings are not necessarily to scale, and while certain features in the drawings appear to have rectangular edges that meet at right angles, those features in fact can be oval, contoured, or rounded in shape in the actual devices.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Magnetic packet memory storage devices, the manufacturing thereof, and the operation thereof are disclosed in: U.S. Pat. No. 6,781,871; U.S. Pat. No. 6,834,005, United States Patent Application Publication 2008/0080092; United States Patent Application Publication 2008/0152794; United States Patent Application Publication 2008/0152953; United States Patent Application Publication 2008/0152954; United States Patent Application Publication 2008/0158710; United States Patent Application Publication 2008/0068880; United States Patent Application Publication 2008/0100963; United States Patent Application Publication 2008/0094760; United States Patent Application Publication 2009/0040883; United States Patent Application Publication 2008/0138659; and United States Patent Application Publication 2008/0137389, the contents of each being incorporated herein by reference.

FIG. 1 is a schematic diagram of a magnetic track storage device, in accordance with an embodiment of the present invention. A magnetic track storage device 12 of the type illustrated in FIG. 1 includes a magnetic track 100. In this embodiment, the magnetic track 100 can comprise a strip of ferromagnetic material. In one embodiment, the strip of ferromagnetic material comprises at least one of Co, Ni and Fe.

The magnetic track 100 extends between a first end E1 and a second end E2, and can extend in a straight line, as shown, for example, in a horizontal direction on a surface of a substrate. In other embodiments, the magnetic track 100 can extend on a horizontal surface in two dimensions, such as in a serpentine or meandering arrangement. In other embodiments, the magnetic track 100 can extend in a vertical direction, such as along sidewalls of a trench or raised structure, for example, according to the configurations and embodiments disclosed in U.S. Pat. No. 6,834,005 and United States Patent Application Publication No. 2008/0152794, incorporated herein by reference above.

The magnetic track 100 includes a plurality of cells, or domains D, which are defined by domain walls DW. Each domain 100.1, 100.2, 100.3, 100.n is an individually addressable data storage location on the magnetic track 100. In some embodiments, the domains D are defined by a notch, or pinning point, formed in a side edge of the magnetic track 100. Such pinning points are not required in embodiments where a current used to move the domain walls of the track can be precisely controlled. This current is referred to herein as a domain wall moving current, and will be discussed in further detail below.

In the embodiment of FIG. 1, a read unit 150 is positioned to correspond with one of the domains $D_{RW}$ of the magnetic track 100. In some embodiments, the read unit can be positioned at the same domain position as a corresponding write unit. In other embodiments, the read unit and the write unit can be separated and correspond with different domains D of the magnetic track 100. For example, the read unit can be positioned at or near the first end E1 of the magnetic track 100 and the write unit can be positioned at or near the second end E2 of the magnetic track 100. In the present embodiment, although the read unit 150 is shown as corresponding with a domain $D_{RW}$ at an intermediate location on the magnetic track 100, the read unit 150 can be positioned at or near any intermediate domain, or can be positioned at the domains D at or near the first or second ends E1, E2.

In the embodiment of FIG. 1, as an example, it is assumed that the read unit 150 and the write unit are positioned at the same domain location $D_{RW}$, and therefore, in this example, they are referred to collectively as a read/write unit 150. The read/write unit 150 includes a write device to which a write current can be applied to write a data element to the corresponding domain $D_{RW}$ of the magnetic track 100. The write current can be applied to the write device, for example at an electrode of the write device. In various embodiments, the write device can comprise a spin transfer torque inducing device, a tunnel magneto resistance device or a giant magneto resistance device. In other embodiments, the write unit device can comprise another device suitable for storing data in the form of magnetic information at the corresponding domain $D_{RW}$.

In the embodiment of FIG. 1 the read/write unit 150 further includes a read device comprising a sensing device to which a read current can be applied to read a data element from the corresponding domain $D_{RW}$ of the magnetic track 100. The read current can be applied to the read device for example at an electrode. In various embodiments, the read device can comprise a spin transfer torque sensing device, a tunnel magneto resistance sensing device or a giant magneto resistance sensing device. In other embodiments, the read device can comprise another device suitable for sensing magnetic information occupying the corresponding domain $D_{RW}$.

In some embodiments, a first switching device (not shown) is coupled to the first end E1 of the magnetic track 100 and a second switching device (not shown) is coupled to the second end E2 of the magnetic track 100. In one embodiment, the first and second switching devices comprise transistors, and sources or drains of the transistors are connected to the first and second ends E1, E2 of the magnetic track respectively. The other of the sources or drains can be connected to conduction lines of the device. Such conduction lines are referred to in conventional memory devices as bit lines. The first and second switching devices control application of a domain wall moving current through the magnetic track 100. In one embodiment, the domain wall moving current is in the form of a current pulse that is applied though the body of the magnetic track 100 in a direction between the first end E1 and the second end E2 or in a direction between the second end E2 and the first end E1. Application of the domain wall moving current pulse results in a shift in the respective positions of the data elements occupying the domains D of the magnetic track. In the present example, a shift of the data elements will occur either in a left-to-right direction or in a right-to-left direction. In certain embodiments, one or both of the first and second switching devices is optional and can be omitted. Examples of such configurations are disclosed in U.S. patent application Ser. No. 12/658,807, filed of even date herewith, entitled "Magnetic Packet Memory Storage Devices, Memory Systems Including Such Devices, and Methods of Controlling Such Devices", by Ho Jung Kim, et al., commonly owned with the present application, and incorporated herein by reference.

In certain embodiments, a third switching device can be coupled to the electrode of the read/write unit 150. In one embodiment, the third switching device comprises a transistor, and a source or drain of the transistor is connected to the electrode. The other of the source or drain can be connected to a conduction line of the device. The third switching device controls application of a write current to the write unit of the read/write unit 150 and application of a read current to the read unit of the read/write unit 150.

During a write operation for writing a data element to the magnetic track 100, the write unit of the read/write unit 150 is activated to cause a write current to flow through the read/write unit 150 and a data element is written to the corresponding domain $D_{Rw}$ of the magnetic track 100. In the write operation, the value of the written data element, or, in other words, the orientation of the magnetic information placed in the corresponding domain $D_{Rw}$ of the magnetic track 100, depends on the direction and/or magnitude of the write current flowing through the read/write unit 150.

During a read operation for reading a data element from the magnetic track 100, the read unit of the read/write unit 150 is activated to cause a read current to flow through read/write unit 150 and a data element present at the corresponding domain $D_{Rw}$ of the magnetic track 100 is read. The value of the data element, or, in other words, the orientation of the magnetic information present in the corresponding domain $D_{Rw}$, depends on the direction and/or magnitude of the sensed read current flowing through the read/write unit 150.

Preceding or following both read and write operations, a domain wall moving current is applied to the magnetic track 100. In one example application of a domain wall moving current, the first switching device and second switching device referred to above are placed in an ON state. As a result, a current is induced through the body of the magnetic track 100, either in a direction from the first end E1 to the second end E2, or in a direction from the second end E2 to the first end E1. This current, referred to herein as a domain wall moving current, operates to shift all positions of the data elements stored in the magnetic track in either a left-to-right direction, or in a right-to-left direction, depending on the orientation, magnitude, and duration of the domain wall moving current.

For example, in a read operation, a read current can be applied to the read/write unit 150 to read the data element stored at the corresponding domain $D_{RW}$ of the magnetic track 100. To read the value of the next domain on the magnetic track, the read current is removed and a domain wall moving current is applied to move the data elements from a left-to-right direction on the magnetic track. The domain wall moving current operates to shift the next data element of the next domain into position for reading. The domain wall moving current is then removed and the read current is again applied to the read/write unit 150 to read the next data element. The process continues in this manner, to read all desired data elements from the magnetic track 100. In other words, a read operation is performed according to the following sequence:

Read Operation read current/move current/read current/move current/read current/move current . . . .

Similarly, in a write operation, a write current can be applied to the read/write unit 150 to write a data element to the corresponding domain $D_{RW}$ of the magnetic track 100. To write the value of the next data element on the magnetic track, the write current is removed and a domain wall moving current is applied to move the data elements from a left-to-right direction on the magnetic track. The domain wall moving current operates to shift the previously written data element one position. The domain wall moving current is then removed and the write current is again applied to the read/write unit 150 to write the next data element. The process continues in this manner, to write all desired data elements to the magnetic track 100. In other words, a write operation is performed according to the following sequence:

Write Operation write current/move current/write current/move current/write current/move current . . . .

During operation, memory devices that incorporate magnetic track storage devices 12 of the type disclosed herein can vary in performance due to a number of factors that include process conditions under which the devices were fabricated and device operating conditions. Such variations can cause the magnetic track storage devices 12 to be subject to a range of performance variations that must be controlled.

For example, the domain wall moving current must be precisely controlled to ensure that the data elements are shifted properly among the domains during read and write operations. If the process or operating conditions change, a domain wall moving current may become inadequate for shifting the domains. Alternatively, a domain wall moving current that is too large may result in over-shifting of domains, or in overconsumption of device power resources.

In embodiments of the present invention, an optimal value of the domain wall moving current is determined by storing a calibration data element on the magnetic track and by calibrating the domain wall moving current based on the calibration data element.

Referring to FIG. 1, in one embodiment, an optimization device 302 is connected to the read/write unit 150. The optimization device 302 includes a sense amplifier S/A, a counter C1, a control logic unit L1 and a register R1.

A calibration data element DR1 is written to the magnetic track 100 according to a normal write operation. In the present example, the calibration data element comprises eight bits in the pattern '10101010', each bit toggling in value relative to a previous bit. During an optimization procedure, referring to FIG. 1, a first data element of the calibration data element DR1, is read by the sense amplifier S/A of the optimization device 302. A domain wall moving current is then applied to the magnetic track 100 to shift the respective positions of the domains D of the magnetic track so that the next domain D is in position to be read. The count value C is initially at '0'.

Referring further to FIG. 1, a magnetic track 100 includes a plurality of domain regions D for storing data and domain wall regions DW formed therebetween. The magnetic track 100 may be formed of a ferromagnetic material. For example, the magnetic track 100 may contain at least one of Co, Ni and Fe, and may further contain another material. The magnetic track 100 may have a shape of a strip. However, the shape of the magnetic track 100 may be variously changed.

The calibration data element, or multiple calibration data elements, DR1 can be stored in a portion of the magnetic track 100. The calibration data element DR1 can be used to optimize a pulse current supplied to the magnetic track 100. This process will be described in further detail below. In one embodiment, the calibration data element DR1 can have, for example, a data pattern in which a first data element (represented by '0') $D_0$ and a second data element (represented by '1') $D_1$ are alternately repeated. A domain corresponding to the first data element $D_0$ and a domain corresponding to the second data element $D_1$ can have opposite magnetization orientation with respect to each other. The first and second data elements $D_0$, $D_1$ may respectively be '0' and '1'. That is, the calibration data element DR1 may have a data pattern of '01010101 . . . '. In other embodiments, the data pattern of the calibration data element DR1 can be variously changed. For example, the calibration data element DR1 can have a data pattern of '10101010 . . . ' or may have variously combined data patterns such as '10100101001 . . . ', '1010010010 . . . ', '1001001001 . . . ' and '11001100 . . . '. '10101010 . . . ' and '11001100 . . . ' for example, representing a case where high-resistance and low-resistance states are arranged at equal intervals. In some cases, different '1' and '0' intervals may be required, since a resistance read is used to perform a read operation. A current is applied to the read unit and the polarization of the magnetization varies the resistance of the domain. In regions of the magnetic track 100 other than the region of the magnetic track 100 in which the calibration data element DR1 is stored, real user data (not shown) can be stored.

A first unit 150 having a data read function can be included in the region of the magnetic track 100 in which the calibration data element DR1 is stored. While the first unit 150 can be configured to perform a data read function, the first unit 150 can also optionally additionally be configured to perform a data write function. That is, the first unit 150 can be a read unit or a read/write unit. The first unit 150 may be regarded as a part of a current optimization device 302 as will be described in further detail below.

As illustrated, the first unit 150 can be disposed under the magnetic track 100, or alternatively, can be disposed above the magnetic track 100, or can be separately disposed both above and below the magnetic track 100. For example, the first unit 150 can comprise a tunnel magneto resistance (TMR) device or a giant magneto resistance (GMR) device.

In this case, the first unit 150 can include a first pinned layer disposed on or under the magnetic track 100, for example, under the magnetic track 100, and can further include a first separation layer disposed between the first pinned layer and the magnetic track 100. Further, the first unit 150 can further include a second pinned layer disposed on or under the magnetic track 100, for example, on the magnetic track 100. The second pinned layer can have a magnetization orientation opposite to that of the first pinned layer. A second separation layer may be included between the second pinned layer and the magnetic track 100. The first unit 150 may further include at least one free layer and at least one anti-ferromagnetic layer. In other embodiments, the configuration of the first unit 150 can be suitable for any of a number of applications. Further, the first unit 150 can have a length that corresponds to one domain D as illustrated, but may be less than or greater than the length of the domain, depending on the application. In one embodiment, the first unit 150 can be disposed at one end of the region at which the calibration data element DR1 is stored (hereinafter referred to as a calibration data region). However, in other embodiments, the position of the first unit 150 can be at other locations. For example, the first unit 150 may be disposed at a central region of the calibration data region or can be spaced apart from the calibration data region.

Meanwhile, although not shown in FIG. 1, an additional at least one read/write unit, or an additional at least one read unit and at least one write unit, can be disposed in a region of the magnetic track 100 other than the region in which the calibration data element DR1 is stored (i.e., a real data region). The additional at least one read/write unit, or the additional at least one read unit and the at least one write unit may be used to write or read real data.

A current generator unit 200 can be connected to a first end E1 of the magnetic track 100. The current generator unit 200 can include a current generator that generates a pulse current. A switching device such as a transistor or a diode can be positioned between the current generator unit 200 and the magnetic track 100 to control the application of current pulses to the magnetic track 100. The current generator unit 200 can supply a pulse current to the magnetic track 100 to effect the movement of domains of the domain regions D and domain walls of the domain wall regions DW in a left-to-right or in a right-to-left direction. In a typical embodiment, the domains and the domain walls are moved in a direction opposite to the direction of the pulse current, i.e., a direction in which electrons move. The current generator unit 200 can optionally be connected to a second end E2 of the magnetic track 100 rather than the first end E1, or, alternatively, can be connected to both the first and second ends E1, E2 of the magnetic track 100.

In embodiments of the invention, a device for optimizing the characteristics of the pulse current supplied to the magnetic track 100 by the current generator unit 200 (hereinafter referred to as a current optimization device 302) can be included. In one embodiment, the current optimization device 302 is connected to the current generator unit 200 and the first unit 150. In further detail, the current optimization device 302 can include a counter C1 connected to the first unit 150. A sense amplifier S/A can be included between the counter C1 and the first unit 150. The counter C1 can comprise a device for counting the number of calibration data elements (single number) that pass the first unit 150 during a read operation, i.e., the number of the first data elements $D_0$ and the second data elements $D_1$. In a case where the domains and the domain walls are moved by 1 bit on the magnetic track 100, the calibration data element DR1 of the magnetic track 100 on which the first unit 150 is formed can repeatedly transition from a '0' value (i.e., the first data element $D_0$) to a '1' value (i.e., the second data element $D_1$) or vice-versa. Since one of the first and second data elements $D_0$, $D_1$ may correspond to low-resistance data and the other may correspond to high-resistance data, an output signal of the sense amplifier S/A may be correspondingly transitioned from a low-resistance signal to a high-resistance signal, or vice versa. The counter C1 can comprise a device for counting and storing the number of data transitions. Accordingly, if the domains and the domain walls are moved by 1 bit on the magnetic track 100 as a result of application of the domain wall moving current, and one transition of the data value occurs, the counter C1 may in this case store a value of '1'. Proceeding further, if the domains and the domain walls are moved by 2 bits on the magnetic track 100 as a result of application of the domain wall moving current, and two transitions of the data value occur, the counter C1 may in this case store a value of '2'.

The current optimization device 302 can include a control logic unit L1 connected to the counter C1 and the current generator unit 200, and can further include a register R1 connected to the control logic unit L1. The control logic unit L1 can vary a width and/or a height of the pulse current supplied to the magnetic track 100 by using the current generator unit 200 according to an output value of the counter C1. To control this, the control logic unit L1 can include various logic circuits. Also, the control logic unit L1 may reset the counter C1 and may write information to the register R1.

While varying the width and/or the height of the pulse current supplied to the magnetic track 100 by using the current generator unit 200, a pulse current having an optimum width and/or a height which is appropriate to move the domains and the domain walls (i.e., an optimum pulse current) can be determined by using the current optimization device 302. An example apparatus and method of determining the optimum pulse current will be described in greater detail below. After the optimum pulse current is determined, information related to the optimum pulse current can be stored in the register R1.

Figure 2:
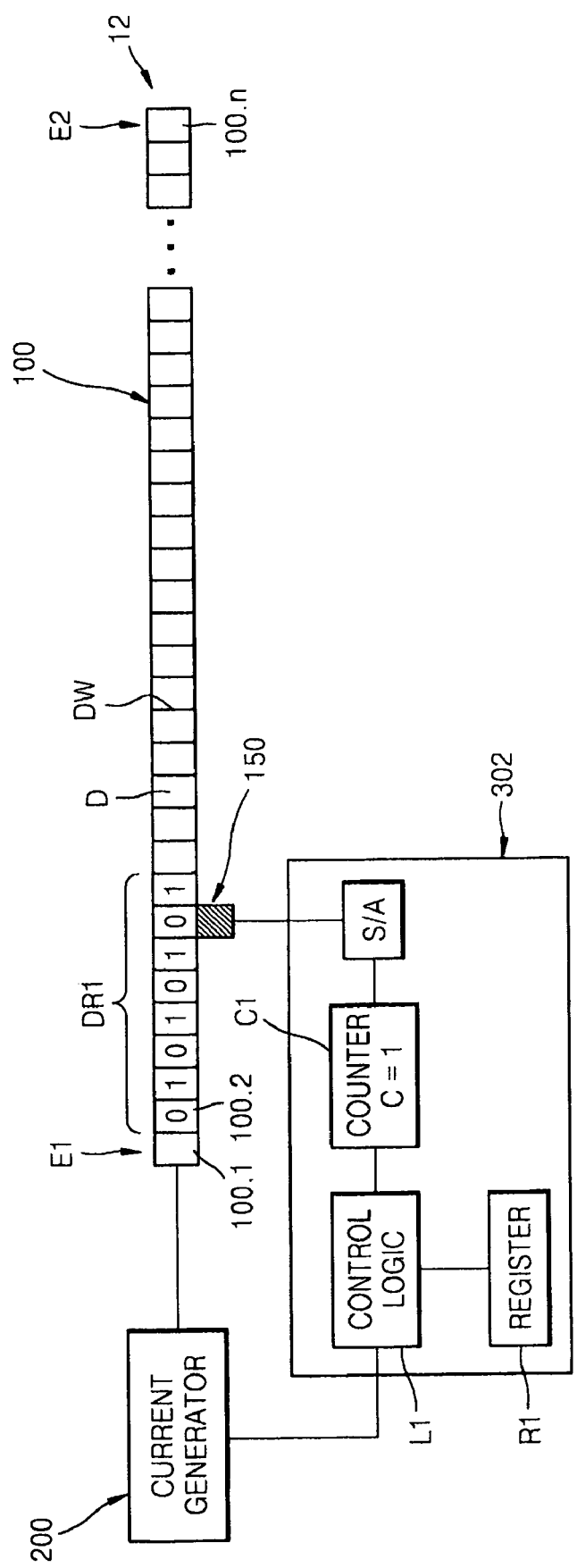
FIG. 2 is a schematic diagram of a magnetic track storage device, illustrating the transitioning of a single data element as a result of the application of a pulse current that moves the domains of the magnetic track by a single domain, in accordance with an embodiment of the present invention.
Figure 3:
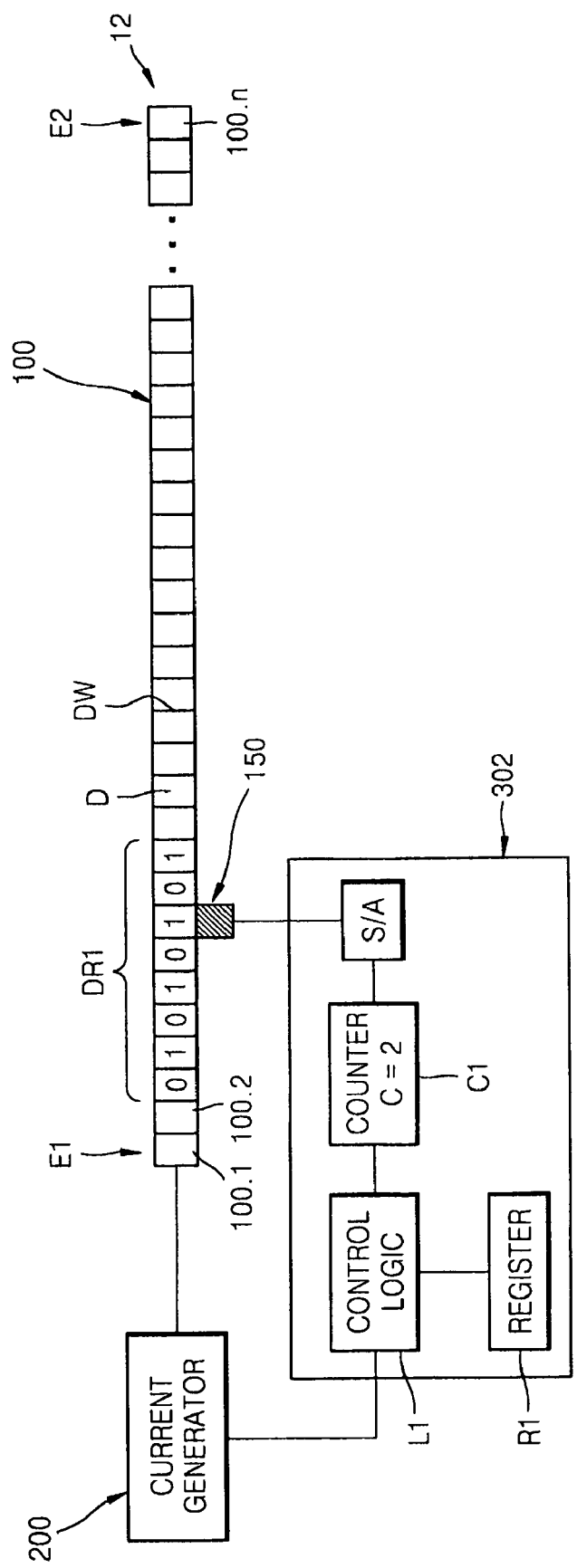
FIG. 3 is a schematic diagram of a magnetic track storage device, illustrating the transitioning of two data elements as a result of the application of a pulse current that moves the domains of the magnetic track by two domains, in accordance with an embodiment of the present invention.

FIG. 2 is a schematic diagram of a magnetic track storage device, illustrating the transitioning of a single data element as a result of the application of a pulse current that moves the domains of the magnetic track by a single domain, in accordance with an embodiment of the present invention. FIG. 3 is a schematic diagram of a magnetic track storage device, illustrating the transitioning of two data elements as a result of the application of a pulse current that moves the domains of the magnetic track by two domains, in accordance with an embodiment of the present invention.

Referring to FIG. 2, beginning with the state of the magnetic track 100 as it appears in FIG. 1, a pulsed domain wall moving current is applied to the magnetic track, and, as a result, the domain walls of the magnetic track 100 are moved in a direction from left to right by one domain. As a result, a single transition of the data of the calibration data element DR1, is detected by the sense amplifier S/A of the optimization device 302. Accordingly, the count value C is increased to '1', since a single transition of the value of the read data bit from a '1' in FIG. 1 to a '0' in FIG. 2 occurred as a result of the application of the pulsed domain wall moving current.

Referring to FIG. 3, again beginning with the state of the magnetic track 100 as it appears in FIG. 1, a pulsed domain wall moving current is applied to the magnetic track, and, as a result, the domain walls of the magnetic track 100 are moved in a direction from left to right by two domains from the starting point. As a result, two transitions of the data of the calibration data element DR1, are detected by the sense amplifier S/A of the optimization device 302. Accordingly, the count value C is increased to '2', since two transitions of the value of the read data bit from a '1' in FIG. 1, to a '0', and then back to a '1' occurred as a result of the second application of the pulsed domain wall moving current.

Figure 4:
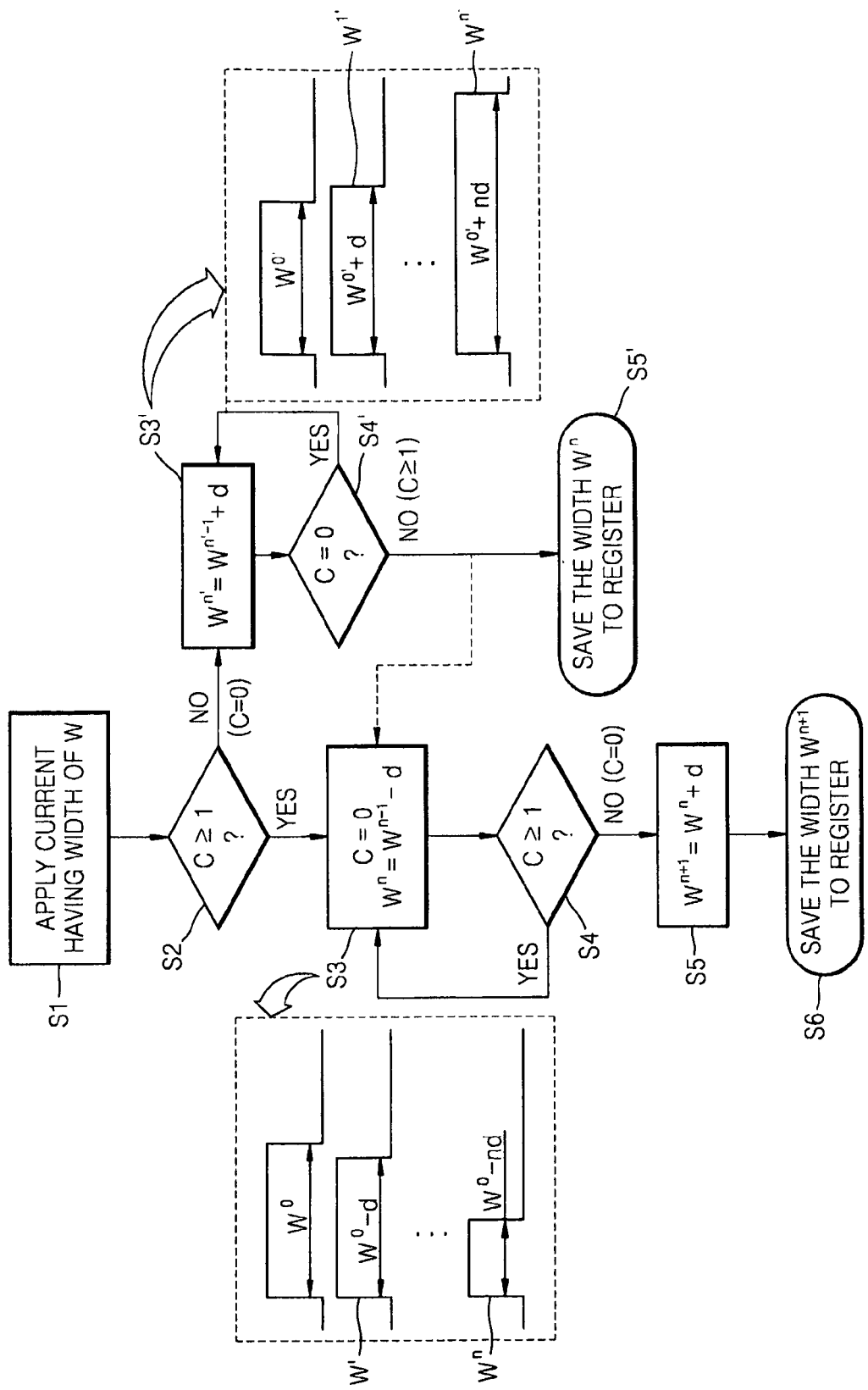
FIGS. 4 and 5 are flow diagrams of a process for the optimization of the width and height of the domain wall moving current pulse, in accordance with embodiments of the present invention.
Figure 5:
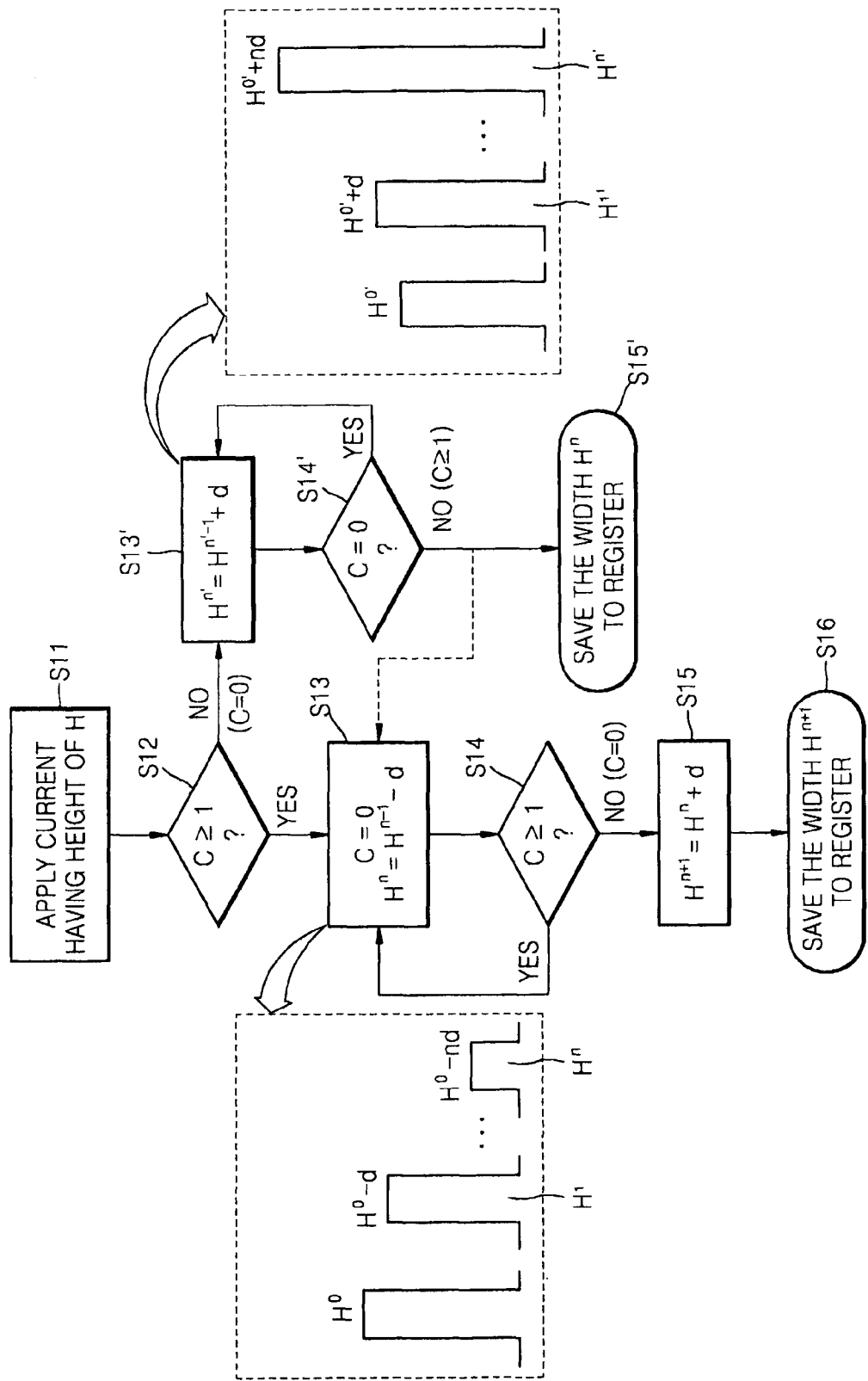

FIGS. 4 and 5 are flow diagrams of a process for the optimization of the width and height of the domain wall moving current pulse, in accordance with embodiments of the present invention.

Referring to FIG. 4, at operation S1, a pulsed domain wall moving current having a predetermined pulse width W can be supplied to the magnetic track 100 by using the current generator unit 200. As a result of the applied pulse of width W, at operation S2, it is determined whether the variable C of the counter C1 satisfies C≧1, which means that domains of the magnetic track 100 have been moved by one or more bits due to the applied pulse current supplied in operation S1. In the event that the condition C≧1 is satisfied in operation S2, that is, if the domains of the magnetic track 100 are moved by one or more bits due to the pulse current supplied in operation S1, the process can proceed to operation S3. In operation S3, initially, the variable C of the counter C1 is reset to 0, and then a reduced-width amount of 'd' can be subtracted from the pulse current supplied in operation S1. Then, this reduced-width pulse current, i.e., a pulse current having a width of 'W−d' can be supplied to the magnetic track 100. It is next determined, at operation S4, whether the variable C of the counter C1 again satisfies C≧1. If the condition C≧1 is satisfied in operation S4, that is, if it is determined that the domains of the magnetic track 100 have been moved by one or more bits due to the application of the reduced-width pulse current, the process can return to operation S3, the variable C may be reset to 0, and then an even further reduced-width pulse current (W−nd) can be supplied to the magnetic track 100. Operations S3 and S4 can be repeatedly performed until the variable C no longer satisfies the condition C1≧1 in operation S4. If the variable C does not satisfy the condition C≧1 in operation S4, that is, if the resulting variable C is 0, this means that the domains have not moved as a result of application of the pulse current. The width of a pulse current that is supplied immediately before the pulse current that satisfies C=0 in operation S4, namely a pulse width of 'W+d', is determined to be the minimum width of a pulse current that moves the domains of the magnetic track 100 at operation S5. Information regarding the minimum width of the pulse current can be stored in the register R1 at operation S6. In this manner, the minimum width, or minimum duration, of a pulse current that is effective in moving the domains and the domain walls by a single domain width can be determined.

Returning to operation S2, if the variable C does not satisfy C≧1 in operation S2, that is, if the variable C is 0, indicating that a data value transition has not occurred, the process can proceed to operation S3'. In operation S3', an additional width amount of 'd' can be added to the pulse current supplied in operation S1. Then, this resulting pulse current of width (W=W+d) can be supplied to the magnetic track 100. It is next determined, at operation S4' whether the variable C of the counter C1 satisfies the condition C=0. If the variable C is 0 in operation S4', the process can return to operation S3' and a longer pulse current can be supplied to the magnetic track 100. Operations S3' and S4' can be repeatedly performed until the condition C=0 is no longer satisfied in operation S4'. If the condition C=0 is not satisfied in operation S4', this means that the domains of the magnetic track 100 have been moved by 1 bit as a result of the application of the pulse current. In this manner, the minimum width, or minimum duration, of a pulse current that is effective in moving the domains and the domain walls by a single domain width is determined. Information regarding the minimum width of the pulse current can be stored in the register R1 at operation S5'.

In an optional embodiment, if the condition C=0 is not satisfied at operation S4', the process may proceed to operation S3, instead of operation S5', along the dashed line between these two operations. As a pulse current that is shorter in width W by 'd' than the pulse current that moves the domains of the magnetic track 100 in operation S4' is supplied to the magnetic track 100 at operation S3, it can be determined whether the pulse current that moves the domains in operation S4' really is a pulse current having a minimum width required to move the domains by a single bit. If the pulse current that moves the domains of the magnetic track 100 in operation S4' is a pulse current having a minimum width required to move the domains by a single bit, after operation S4' is performed, if the process proceeds to operation S3 and then to operation S4, the variable C will not satisfy C≧1 and thus the process will proceed to operations S5 and S6.

A pulsed domain wall moving current having a minimum width required to move the domains and the domain walls can be thereby determined by using the process described in FIG. 4, and current consumption during device operation can be thereby minimized.

Referring to FIG. 5, at operation S11, a pulsed domain wall moving current having a predetermined pulse height H can be supplied to the magnetic track 100 by using the current generator unit 200. As a result of the applied pulse of height H, at operation S12, it is determined whether the variable C of the counter C1 satisfies C≧1, which means that domains of the magnetic track 100 have been moved by one or more bits due to the applied pulse current supplied in operation S11. In the event that the condition C≧1 is satisfied in operation S12, that is, if the domains of the magnetic track 100 are moved by one or more bits due to the pulse current supplied in operation S11, the process can proceed to operation S13. In operation S13, initially, the variable C of the counter C1 is reset to 0, and then a reduced-height amount of 'd' can be subtracted from the pulse current supplied in operation S11. Then, this reduced-height pulse current, i.e., a pulse current having a height of 'H−d' can be supplied to the magnetic track 100. It is next determined, at operation S14, whether the variable C of the counter C1 again satisfies C≧1. If the condition C≧1 is satisfied in operation S14, that is, if it is determined that the domains of the magnetic track 100 have been moved by one or more bits due to the application of the reduced-height pulse current, the process can return to operation S13, the variable C may be reset to 0, and then an even further reduced-height pulse current can be supplied to the magnetic track 100. Operations S13 and S14 can be repeatedly performed until the variable C no longer satisfies the condition C≧1 in operation S14. If the variable C does not satisfy the condition C≧1 in operation S14, that is, if the resulting variable C is 0, this means that the domains are not moved as a result of application of the pulse current. The height of a pulse current that is supplied immediately before the pulse current that satisfies C=0 in operation S14, namely a pulse height of 'H+d', is determined to be the minimum height of a pulse current that moves the domains of the magnetic track 100 at operation S15. Information regarding the minimum height of the pulse current can be stored in the register R1 at operation S16. In this manner, the minimum height, or minimum amplitude, of a pulse current that is effective in moving the domains and the domain walls by a single domain width can be determined.

Returning to operation S12, if the variable C does not satisfy C≧1 in operation S12, that is, if the variable C is 0, indicating that a data value transition has not occurred, the process can proceed to operation S13'. In operation S13', an additional height amount of 'd' can be added to the pulse current supplied in operation S11. Then, this resulting pulse current of height (H=H+d) can be supplied to the magnetic track 100. It is next determined, at operation S4' whether the variable C of the counter C1 satisfies the condition C=0. If the variable C is 0 in operation S14', the process can return to operation S13' and a longer pulse current can be supplied to the magnetic track 100. Operations S13' and S14' can be repeatedly performed until the condition C=0 is no longer satisfied in operation S14'. If the condition C=0 is not satisfied in operation S14', this means that the domains of the magnetic track 100 have been moved by 1 bit as a result of the application of the pulse current. In this manner, the minimum height, or minimum amplitude, of a pulse current that is effective in moving the domains and the domain walls by a single domain width is determined. Information regarding the minimum height of the pulse current can be stored in the register R1 at operation S15'.

In an optional embodiment, if the condition C=0 is not satisfied at operation S14', the process may proceed to operation S13, instead of operation S15', along the dashed line between these two operations. As a pulse current that is shorter in height H by 'd' than the pulse current that moves the domains of the magnetic track 100 in operation S14' is supplied to the magnetic track 100 at operation S13, it can be determined whether the pulse current that moves the domains in operation S14' really is a pulse current having a minimum height required to move the domains by a single bit. If the pulse current that moves the domains of the magnetic track 100 in operation S14' is a pulse current having a minimum height required to move the domains by a single bit, after operation S14' is performed, if the process proceeds to operation S13 and then to operation S14, the variable C will not satisfy C≧1 and thus the process will proceed to operations S15 and S16.

A pulsed domain wall moving current having a minimum height required to move the domains and the domain walls can be thereby determined by using the process described in FIG. 5, and current consumption during device operation can be thereby minimized.

In various embodiments, a domain wall moving current pulse having either a minimum width or a minimum height can be determined as an optimal domain wall moving current pulse. In other embodiments, a domain wall moving current pulse having both a minimum width and a minimum height can be determined as an optimal domain wall moving current pulse. Although a pulse current having a minimum width and/or a minimum height required to move domains and domain walls may be used as an optimum pulse current as described above, embodiments of the present invention are not limited thereto. That is, in accordance with another embodiment of the present invention, a pulse current having a minimum width and/or a height required to move domains and domain walls is not directly used as an optimum pulse current. For example, a pulse current having a width and/or a height that is slightly greater than the thus-determined minimum width and/or the minimum height can be used as the optimum pulse current.

Figure 6:
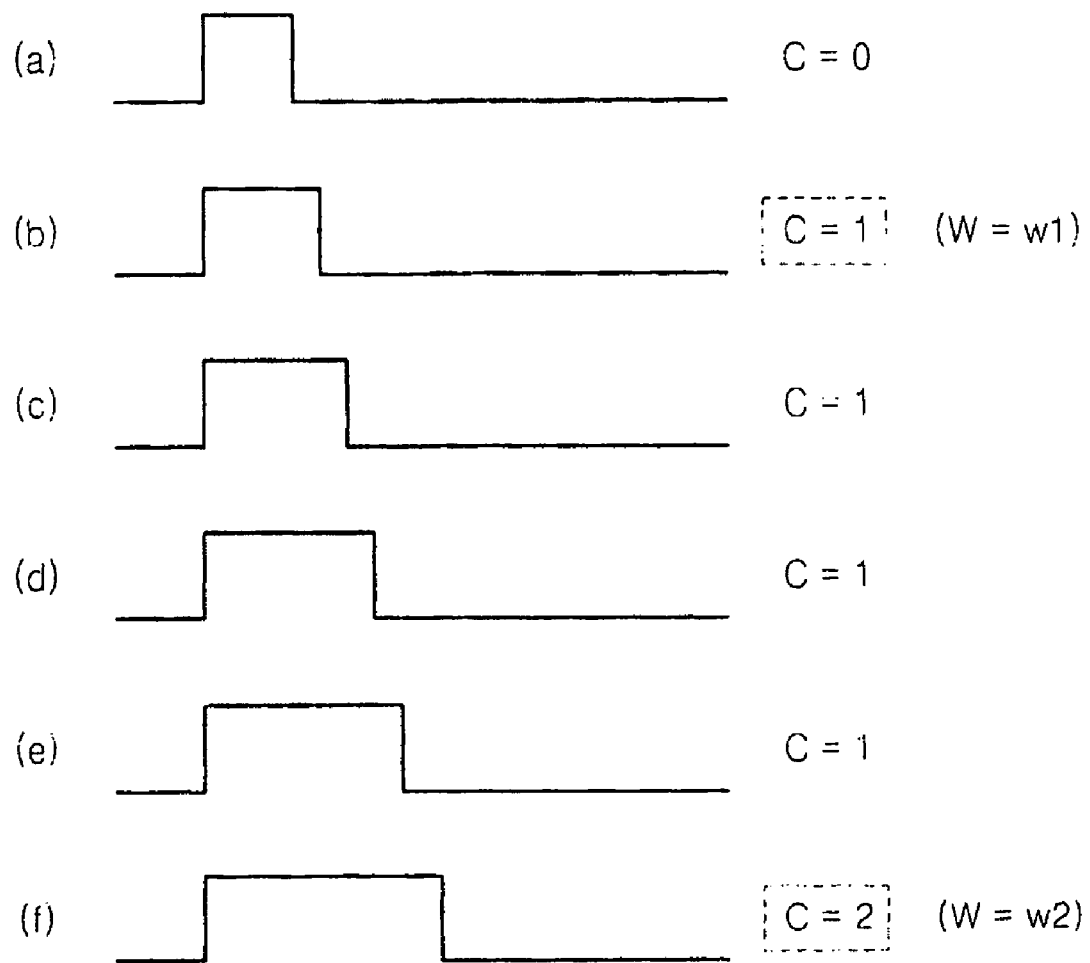
FIG. 6 is a conceptual diagram of a process for the optimization of the width of the domain wall moving current pulse, in accordance with another embodiment of the present invention.

FIG. 6 is a conceptual diagram of a process for the optimization of the width of the domain wall moving current pulse, in accordance with another embodiment of the present invention. Referring to FIG. 6, in this approach, a first optimum current pulse width is determined Referring to FIG. 6, the variable C of the counter C1 is monitored while increasing the width W of a pulsed domain wall moving current supplied to the magnetic track 100. The width of the applied pulse current is gradually increased from operation (a) to operation (f) of FIG. 6. In one example embodiment, the variable C as a result of operation (a) is 0 and the variable C as a result of operation (b) is 1. This means that the pulse current in operation (b) has a minimum width required to move the domains by a single bit. The variable C as a result of operations (c) through (e) is 1 and the variable C as a result of operation (f) is 2. This means that the pulse current in operation (f) has a minimum width required to move the domains by two bits. Assuming the width of the pulse current in operation (b) is referred to as w1 and the width of the pulse current in operation (f) is referred to as w2, an optimum width of the pulse current according to the current embodiment can be determined as (w1+w2)/2. This may be determined to be similar to the width of the pulse current applied during operation (d). As such, according to the current embodiment, an intermediate value [(w1+w2)/2] between a minimum width required to move the domains by a single bit (w1) and a minimum width required to move the domains by two bits (w2) can be determined as the optimum width of the pulse current required to move the domains and the domain walls by a single bit. When a pulsed domain wall moving current having a width corresponding to the intermediate value is used as a pulse current required to move the domains and the domain walls, the reliability of moving the domains and the domain walls in units of a bit can be thereby increased.

Although not illustrated, an optimum height of a pulse current can be found by using a process similar to the process of FIG. 6. That is, the variable C of the counter C1 can be monitored by increasing a height of a pulse current, and an intermediate value [(h1+h2)/2] between a minimum height required to move the domains by a single bit (h1) and a minimum height required to move the domains by two bits (h2) can be determined as the optimum height of the pulse current required to move the domains and the domain walls. Also, similarly, an optimum width and a height of a pulse current may be determined by simultaneously varying a width and a height of the pulse current.

Additionally, although, in the above-described previous embodiments of the present invention, a minimum pulse current (threshold pulse current) required to move the domains and the domain walls by a single bit can be determined as an optimum pulse current, or an intermediate pulse current between a minimum pulse current (threshold pulse current) required to move the domains and the domain walls by 1 bit and a minimum pulse current (threshold pulse current) required to move the domains and the domain walls by two bits can be determined as an optimum pulse current, the present invention is not limited thereto. That is, a pulse current to be determined as an optimum pulse current can be determined and applied, according to system requirements. Accordingly, the configuration of the current optimization device 302 illustrated in FIG. 1 may also be varied.

Figure 7:
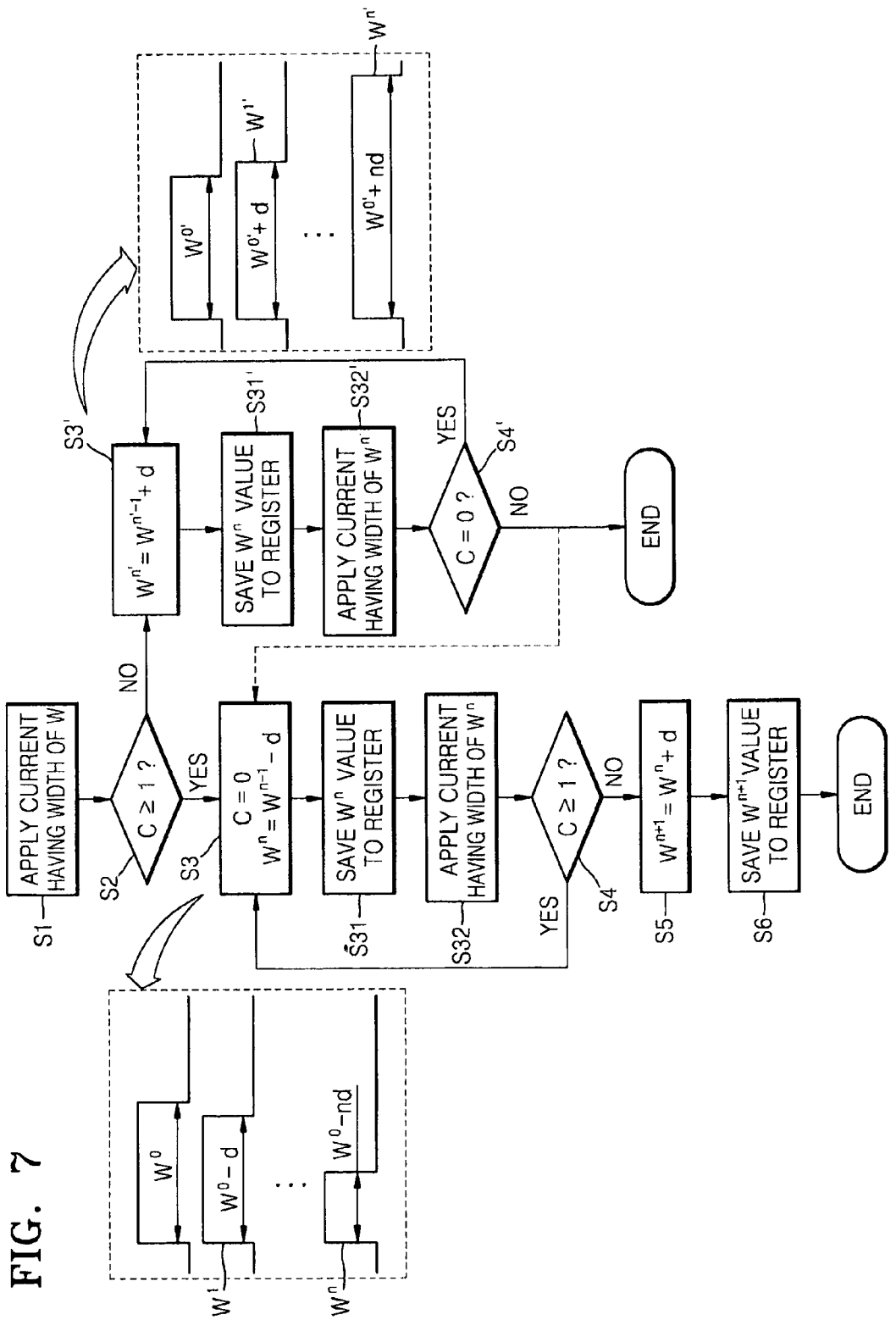
FIGS. 7 and 8 are flow diagrams of a process for the optimization of the width and height of the domain wall moving current pulse, in accordance with other embodiments of the present invention.
Figure 8:
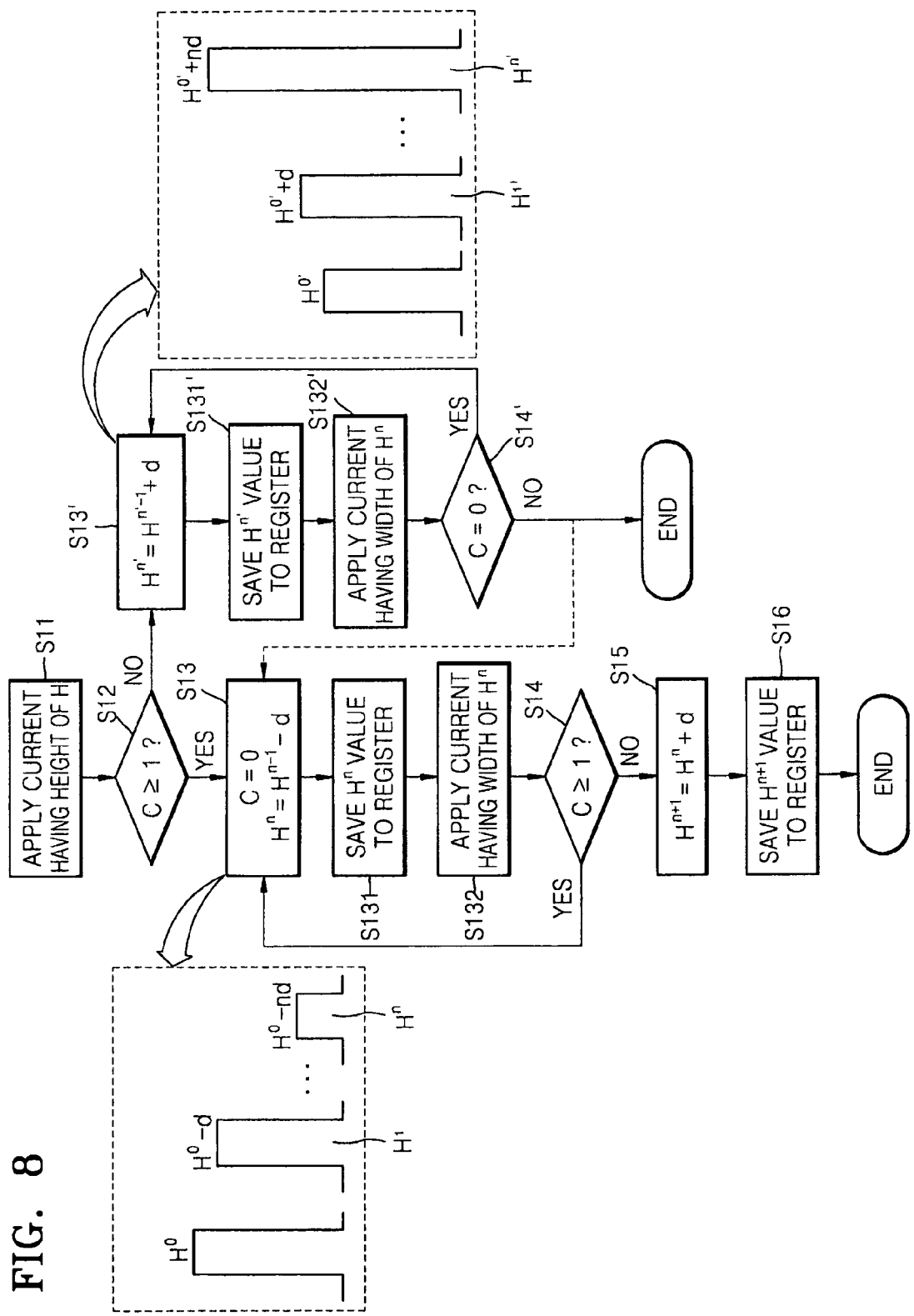

FIGS. 7 and 8 are flow diagrams of a process for the optimization of the width and height of the domain wall moving current pulse, in accordance with other embodiments of the present invention.

Referring to FIG. 7, many of the operations of the embodiment of FIG. 7 are similar to the operations of FIG. 4. For example, operations S1, S2, S3, S4, S5, S6 and S3', S4' are similar to their corresponding operations in the embodiment of FIG. 4. Detailed description thereof will therefore not be repeated in connection with the present embodiment. In the present embodiment, after the application of operation S3, at operation S31 the current pulse width value W is stored in the register R1. Next, a domain wall moving current defined by the current pulse width value W is applied to the magnetic track 100 at operation S32. It is next determined at operation S4, whether the variable C of the counter C1 again satisfies the condition C≧1, as described above in connection with FIG. 4.

In a case where the process from operation S2 to operation S3', the additional width value of 'd' can be added to the width of the pulse current supplied in operation S3'. Following this, the resultant width value (i.e., W=W+d) can be stored in the register R1, at operation S31'. Next, a domain wall moving current defined by the current pulse width value W is applied to the magnetic track 100 at operation S32'. It is next determined at operation S4', whether the variable C of the counter C1 satisfies the condition C=0, as described above in connection with FIG. 4.

In this embodiment, since the current pulse width value W is stored at each iteration at step S31, S31', and applied at step S32, S32', an optimal value for W can be determined. For example, if application of current pulse values W−d, W−2d, W−3d, W−4d result in a count value of 1 while application of W−5d, W−6d result in a count value of 0, a width value of W−2d or W−3d can be chosen to achieve an optimal margin, reducing the likelihood of error.

Referring to FIG. 8, many of the operations of the embodiment of FIG. 8 are similar to the operations of FIG. 5. For example, operations S11, S12, S13, S14, S15, S16 and S13', S14' are similar to their corresponding operations in the embodiment of FIG. 5. Detailed description thereof will therefore not be repeated in connection with the present embodiment. In the present embodiment, after the application of operation S13, at operation S131, the current pulse height value H is stored in the register R1. Next, a domain wall moving current defined by the current pulse height value H is applied to the magnetic track 100 at operation S132. It is next determined at operation S14, whether the variable C of the counter C1 again satisfies the condition C≧1, as described above in connection with FIG. 5.

In a case where the process from operation S12 to operation S13', the additional height value of 'd' can be added to the height of the pulse current supplied in operation S13'. Following this, the resultant height value (i.e., H=H+d) can be stored in the register R1, at operation S131'. Next, a domain wall moving current defined by the current pulse height value H is applied to the magnetic track 100 at operation S132'. It is next determined at operation S14', whether the variable C of the counter C1 satisfies the condition C=0, as described above in connection with FIG. 5.

In this embodiment, since the current pulse height value H is stored at each iteration at step S131, S131', and applied at step S132, S132', an optimal value for H can be determined. For example, if application of current pulse values H−d, H−2d, H−3d, H−4d result in a count value of 1 while application of H−5d, H−6d result in a count value of 0, a height value of H−2d or H−3d can be chosen to achieve an optimal margin, reducing the likelihood of error.

Figure 9:
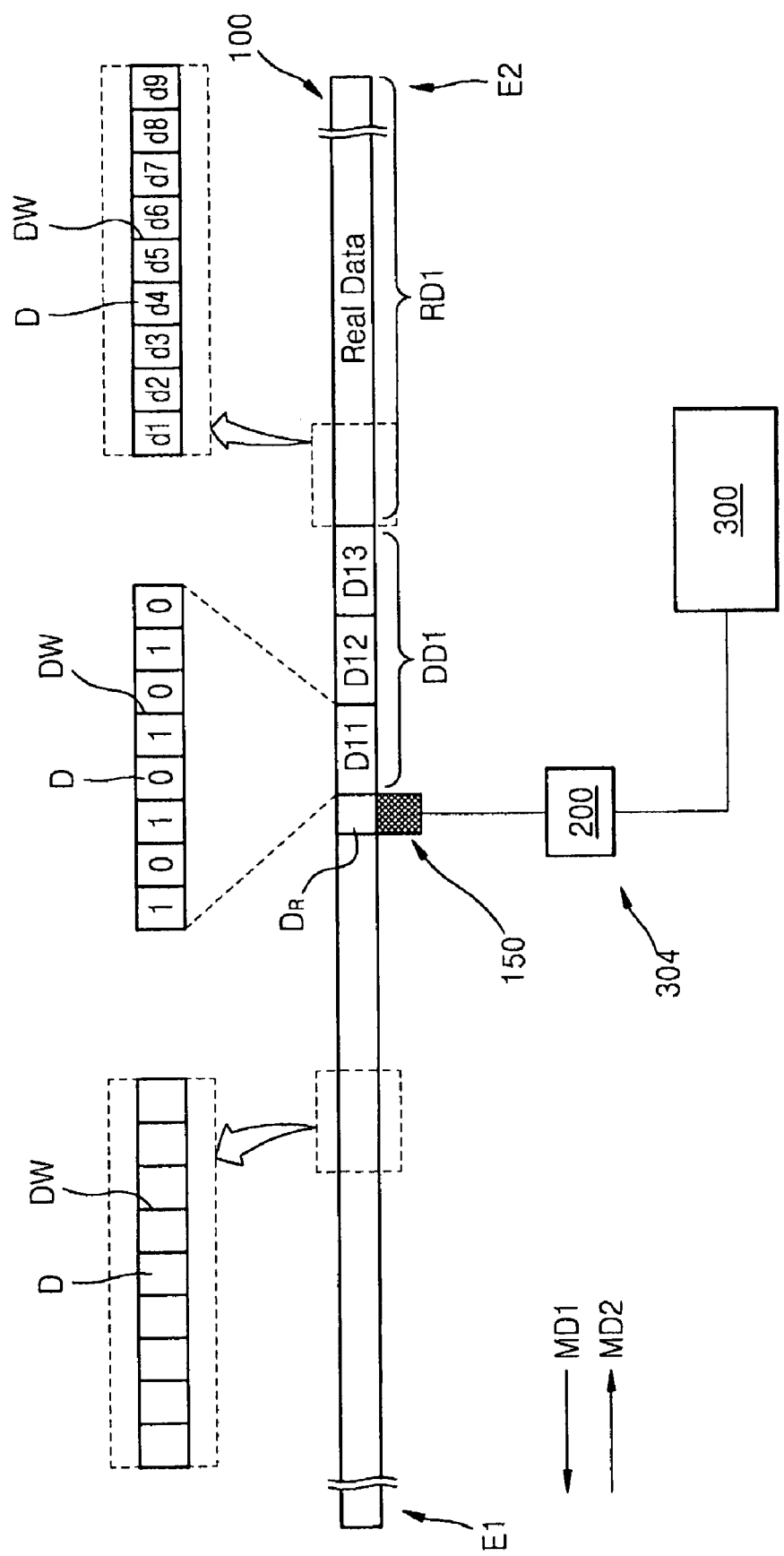
FIG. 9 is a conceptual diagram of an identification system configured to identify the presence of a information data pattern recorded on a magnetic track, which, in turn, identifies the position of real data recorded on the magnetic track associated with the information data pattern, in accordance with another embodiment of the present invention.

FIG. 9 is a conceptual diagram of an identification system configured to identify the presence of a information data pattern recorded on a magnetic track, which, in turn, identifies the position of real data recorded on the magnetic track associated with the information data pattern, in accordance with another embodiment of the present invention. Referring to FIG. 9, a first identification data pattern DD1 is recorded on the magnetic track adjacent to, or concatenated with, real data RD1. In one embodiment, the real data RD1 comprises a series of data elements, for example data elements d1 . . . d9 recorded in sequential domains D of the magnetic track 100. The real data RD1 can include various numbers of bits of data, for example, including 64, 128, 256, 512, 1024, 2048, 4096, or 8192 bits, or any other suitable numbers of bits.

The first identification data pattern DD1 precedes or follows the real data RD1, and includes, in this example, sub-identification data patterns D11, D12, D13. The sub-identification data patterns can include, in different embodiments, certain identifiable bit patterns such as:

Example 1

Identification Data Pattern DD1

D11: 10101010
D12: 01010101
D13: 10101010

Example 2

Identification Data Pattern DD1

D11: 10101010
D12: 10101010
D13: 10101010

Example 1 above includes three sub-identification data patterns D11, D12, D13 and each pattern has the same toggling bit pattern AAh, 55h, AAh. The toggling bit patterns for the D11 and D13 sub-identification data patterns are different than the toggling bit patterns for the D12 sub-identification data pattern.

Example 2 above includes three sub-identification data patterns D11, D12, D13 and each pattern has a toggling bit pattern AAh, AAh, AAh, which are all the same.

The first identification data pattern DD1 can be directly adjacent, that is directly preceding or directly following, the real data RD1 associated with that pattern DD1, or can be spaced apart from the real data RD1 by a known number of domains of the magnetic track.

The length in bits of the sub-identification data patterns D11, D12, D13 can include, for example, 8, 16, or 32 bits, or any other suitable number of bits. The number of sub-identification data patterns D11, D12, D13 included in an identification data pattern DD1 can include for example, 1, 2, 3, or more, or any suitable number of dummy data patterns.

The data position identification system 304 includes a read unit 150, a sense amplifier 200 and a position detection unit 300. The read unit 150 is positioned to correspond with a domain location $D_R$ of the magnetic track 100.

As described above, a domain wall moving current is applied to the magnetic track 100 to shift all positions of the data elements stored in the magnetic track in either a left-to-right direction MD2, or in a right-to-left direction MD1.

In one example, the identification system according to embodiments of the invention is applicable for detecting the position of the real data RD1 previously recorded on the magnetic track 100. A read operation can be performed by applying the domain wall moving current to cause a shift of the domains of the magnetic track in one of the MD1 and MD2 directions, and, following each shift, the data present at the read domain location $D_R$ can be read by the read unit 150 and delivered to the sense amplifier 200. The data output by the sense amplifier 200 can be transmitted to the position detection unit 300 for further processing and determination of the position of the real data.

In certain embodiments, the position detection unit 300 can comprise a combinatorial logic circuit that identifies the presence of the sub-identification data patterns D11, D12, D13 or the identification data pattern DD1 based on the pattern of bits recorded in the domains of the magnetic track 100 during an identification operation. When a bit pattern match is detected, the position detection unit 300 can make a decision as to the location of the real data RD1 associated with the sub-identification data patterns D11, D12, D13 or the identification data pattern DD1.

Use of combinatorial logic in position detection of the real data RD1 is an advantageous improvement over the conventional approach of using a counter for counting the positions of the data elements relative to a synchronization pattern.

Figure 10:
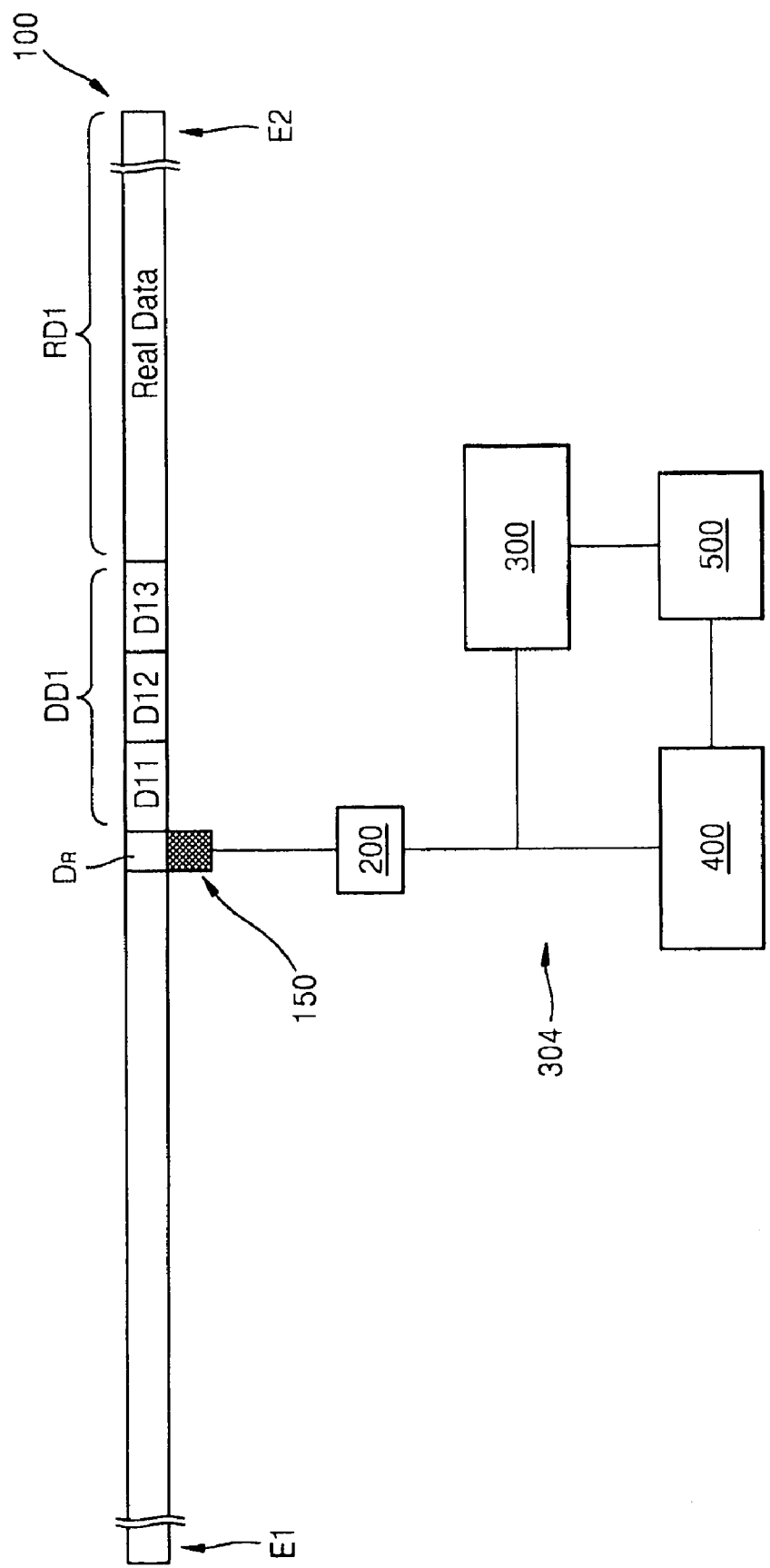
FIG. 10 is a conceptual diagram of a data position identification system configured to identify the presence of a information data pattern recorded on a magnetic track, in accordance with another embodiment of the present invention.

FIG. 10 is a conceptual diagram of a data position identification system 304 configured to identify the presence of a information data pattern recorded on a magnetic track, in accordance with another embodiment of the present invention. The embodiment of FIG. 10 is similar in configuration to the embodiment of FIG. 9. In the embodiment of FIG. 10, however, the data position identification system 304 further includes a temporary storage unit 400 that communicates with the sense amplifier 200 and the position detection unit 300, and a controller 500 that communicates with the temporary storage unit 400 and the position detector 300. In some embodiments, the temporary storage unit 400 comprises a memory unit such as a flash or SRAM memory unit.

As illustrated in FIG. 10, the temporary storage unit 400 for temporarily storing information read by the write/read unit 150 illustrated in FIG. 9 can be further included. The temporary storage unit 400 can be connected to the write/read unit 150 through the sense amplifier 200. The temporary storage unit 400 can comprise a type of cache memory having the structure of a general non-volatile memory device. For example, the temporary storage unit 400 can comprise static RAM (SRAM) or flash memory (NAND or NOR), or can also be a different type of memory device. The temporary storage unit 400 can be small in size and can be readily formed using a conventional semiconductor fabrication process. Further, the temporary storage unit 400 can be commonly connected to a plurality of magnetic tracks 100 and can be positioned in a peripheral circuit region of the device. Accordingly, the temporary storage unit 400 minimally influences the writing density of the magnetic track storage device and does not complicate manufacturing of the device. The controller 500 for controlling the temporary storage unit 400 can be further included. The controller 500 can receive information output from the position detection unit 300 so as to control the temporary storage unit 400. The controller 500 can be connected to the temporary storage unit 400 and the position detection unit 300.

Figure 11:
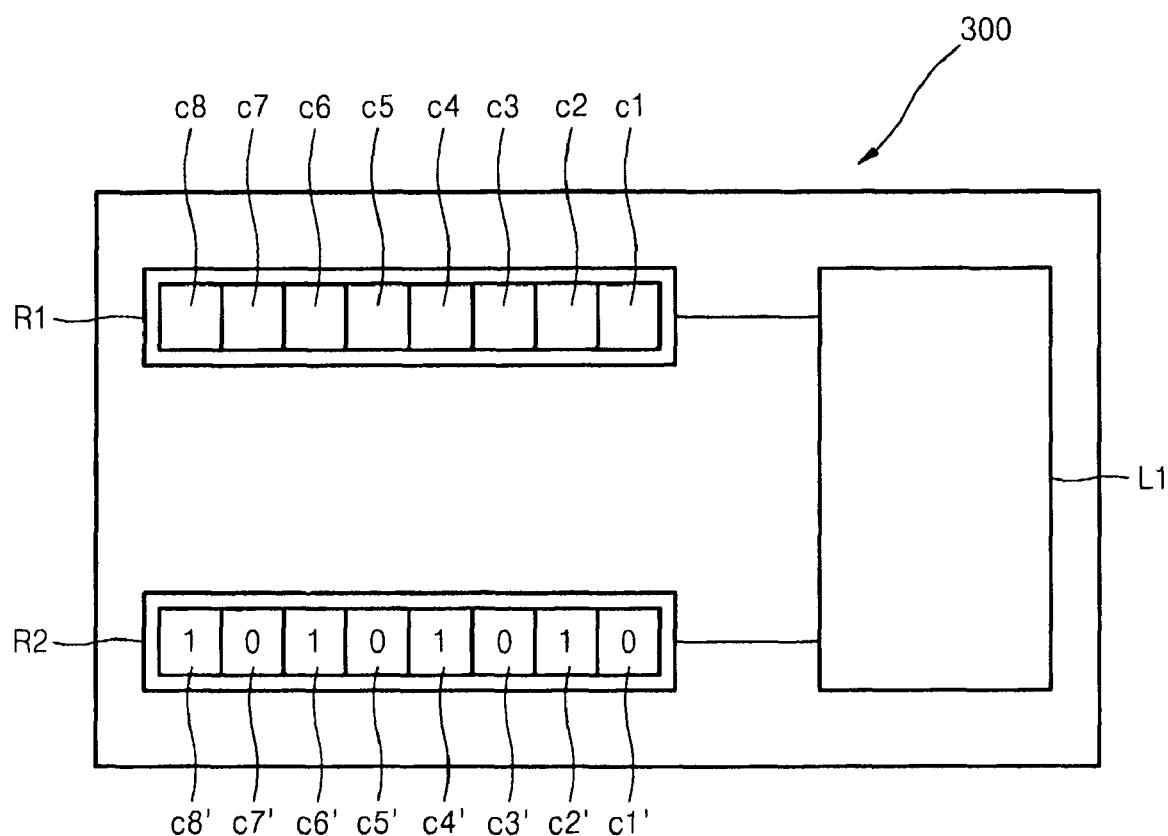
FIG. 11 is a schematic block diagram of an embodiment of the position detection unit of FIGS. 9 and 10, in accordance with embodiments of the present invention.

FIG. 11 is a schematic block diagram of an embodiment of the position detection unit 300 of FIGS. 7 and 8, in accordance with embodiments of the present invention. In this embodiment, the position detector unit 300 includes a data register R1, a reference register R2 and a comparison unit L1. The data register R1 is a register that can store for example the sequential data read by the read unit 150 and sense amplifier 200, and is of a size in bits that is the same as the size of the sub-identification data pattern or the identification data pattern DD1. In the present example, the data register R1 is eight bits in size, and therefore, it is the same size as the sub-identification data pattern D11. The reference register R2 is of the same size as the data register R1 and stores the expected identifiable bit pattern, for example, the D11 bit pattern 10101010, or the D12 bit pattern 01010101. The comparison unit L1 compares the contents of the two registers and outputs a result of the comparison. More than one reference register R2 can be included, depending on the number of different identifiable bit patterns that are used in the data position identification operation.

In one example data identification operation, the position detection unit 300 can be used to identify whether three patterns of 10101010 are read in sequence. With reference to the above Example 1, assuming three patterns of 10101010 are read in sequence, it can be determined that the identification data pattern DD1 has been read, and therefore, that the next data elements to be read by the read unit will be the first data elements of the real data field RD1.

In another embodiment, the identifiable bit patterns comprise a plurality of bits that are hard-wired at the time of manufacturing, for example connected to power and ground sources, or programmed by fuses, at the time of manufacturing.

Figure 12:
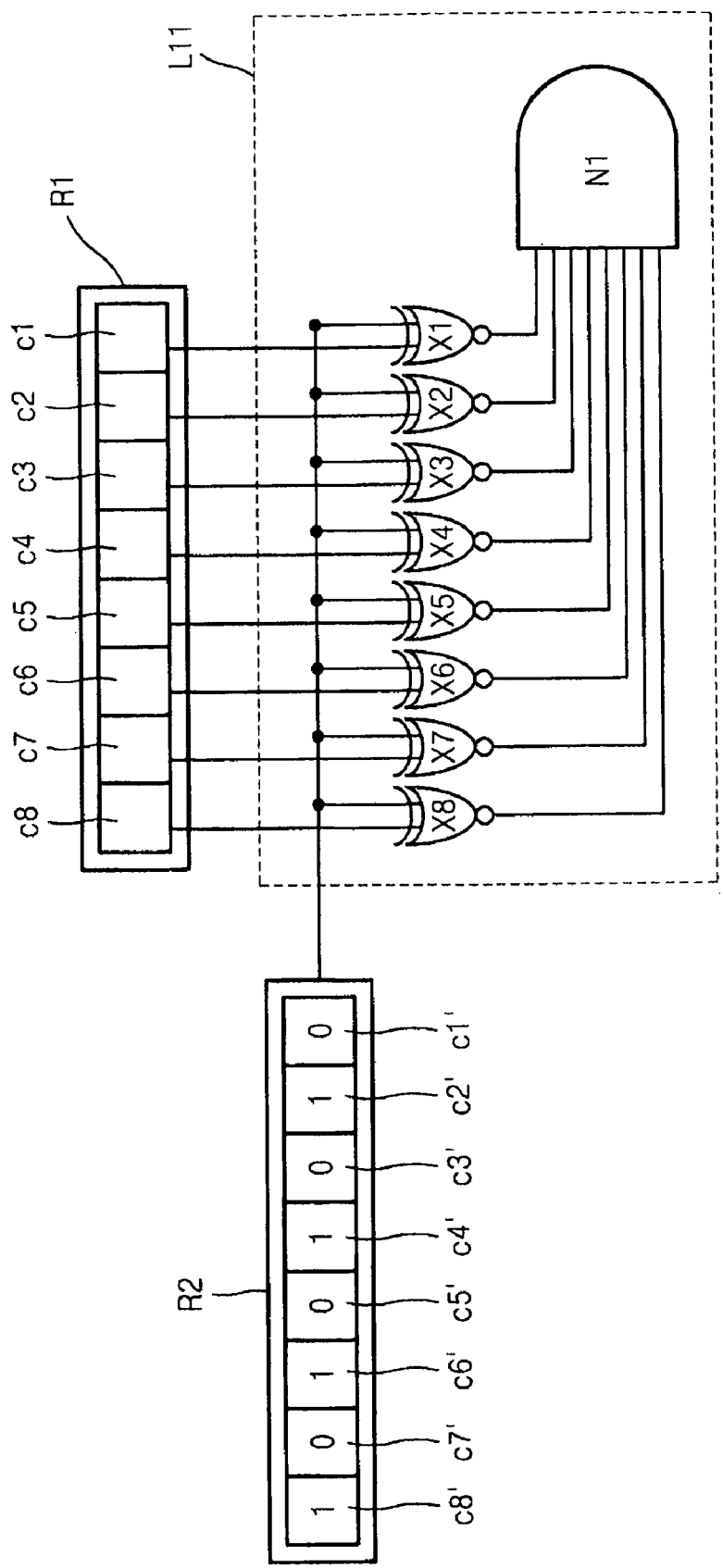
FIG. 12 is a schematic diagram of an embodiment of the comparison unit of FIG. 11, in accordance with embodiments of the present invention.

FIG. 12 is a schematic diagram of an embodiment of the comparison unit of FIG. 11, in accordance with embodiments of the present invention. In this example embodiment, it can be seen that the comparison unit L11 includes eight XNOR logic gates. Each XNOR logic gate receives a bit of the data register R1 and a corresponding bit of the reference register R2. The outputs of the XNOR logic gates are input to an 8-input AND gate N1. The output of the AND gate N1 is a bit-by-bit comparison result of the contents of the data register R1 and the reference register R2. In this example, if the output of the AND gate N1 is high, this indicates a "match" has occurred, and if the output of the AND gate N1 is low, this indicates a "match" has not occurred.

When a match occurs with regard to the data identification pattern DD1, then the position of the real data RD1 associated with the data identification pattern DD1 is known. For example, system protocol may require that the first bit of written real data occupy domains beginning with the domain directly adjacent the last domain of the data identification pattern. In this case, when a match occurs, then the system knows that the domains of the magnetic track can be shifted and the first bit of real data can be read. Similarly, if system protocol requires a certain spacing of "n" domains between the real data and its data identification pattern, then, when a match occurs in this case, the system knows that following a shift in the "n" domains, the real data can be read.

In the above embodiments of FIGS. 9 and 10, the read unit 150 and a write unit (not shown) are positioned at a central region of the magnetic track 100, for example at domain $D_R$ of the magnetic track 100. These embodiments illustrate a buffered arrangement in that data are initially written to one side, for example, between the domain position $D_R$ and the first end E1, or another side, for example, between the domain position $D_R$ and the second end E2. During a write operation, the domain wall moving current is applied in a first direction, for example in the MD2 direction. For a subsequent read operation, the domain wall moving current is again applied in the first direction and the data elements are read and thereby shifted to the other side of the magnetic track. For a next read operation, the domain wall moving current is now applied in the second direction MD1 and the data elements are read and thereby placed on the other, original, side of the magnetic track. This is referred to as a "buffered" arrangement. The buffered arrangement offers the advantage that only a single read unit 150 and corresponding write unit is required for each magnetic track 100, and therefore the supporting circuitry is simpler; however, the buffered arrangement occupies about twice the recording density of the non-buffered arrangements described below.

Figure 13:
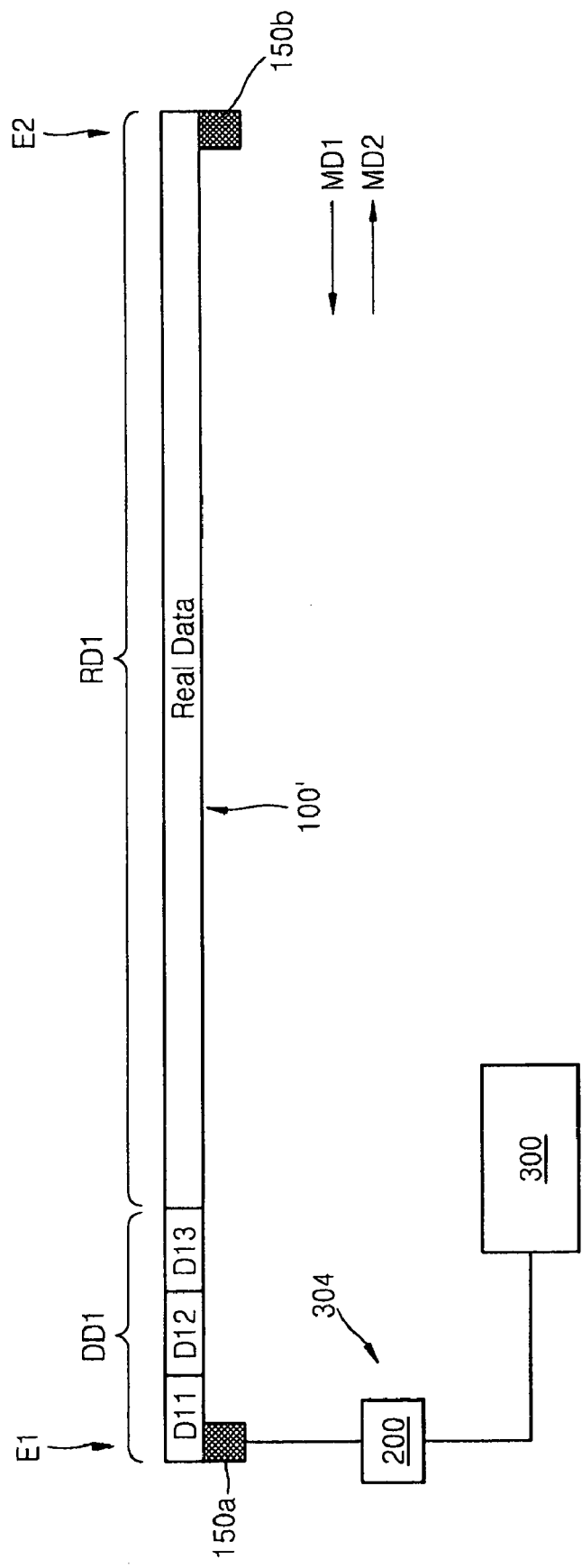
FIGS. 13 and 14 are conceptual diagrams of a data position identification system configured to identify the presence of a information data pattern recorded on a magnetic track, in accordance with other embodiments of the present invention

FIG. 13 is a conceptual diagram of a data position identification system 304 configured to identify the presence of a information data pattern recorded on a magnetic track, in accordance with another embodiment of the present invention. The embodiment of FIG. 13 illustrates a "non-buffered"

arrangement. In such a non-buffered arrangement, all domains D of the magnetic track 100' are available for storing data, since the read unit 150a and write unit 150b are positioned at or near opposite first and second ends E1, E2 of the magnetic track 100'. In one embodiment of the non-buffered arrangement, the data element located at the domain position associated with the read unit 150 at the first end E1 of the magnetic track 100' and sensed by the sense amplifier controller SA1 during a read operation is automatically transferred to the write unit 150b via a feedback line (not shown) and is stored at the second end E2 of the magnetic track 100' by the write unit 150b. In this manner, a buffer, or other temporary storage medium, is not required for temporary storage of the data read by the read unit 150b.

The data position identification system 304 of the embodiment of FIG. 13 is similar to the identification system described above in connection with FIG. 9, in that it includes a read unit 150a, a sense amplifier 200 and a position detection unit 300. The read unit 150a is positioned to correspond with a domain location of the magnetic track 100' where data can be read. A difference lies in that the present identification system of the embodiment of FIG. 13 has a non-buffered magnetic track arrangement.

Figure 14:
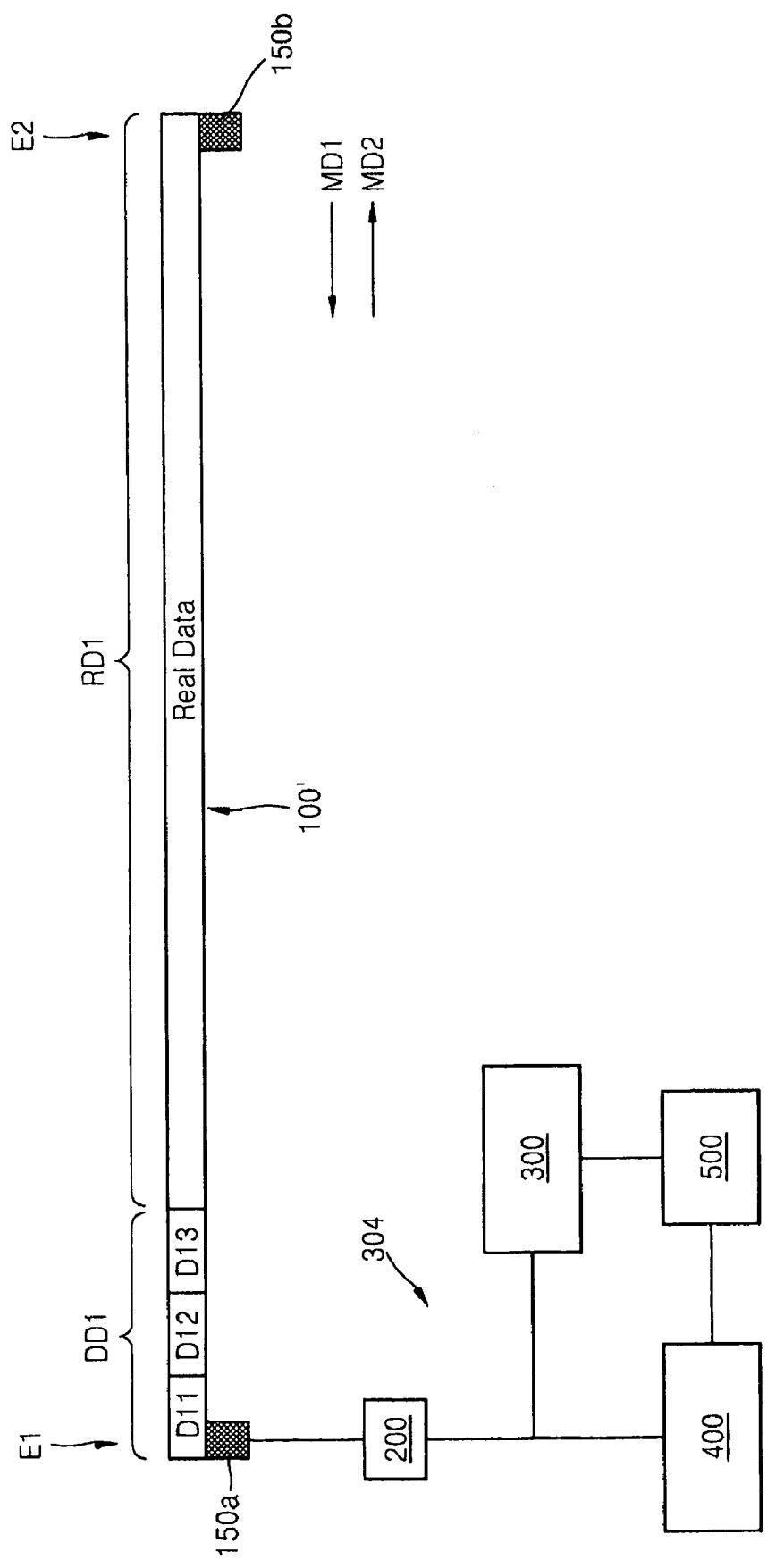

FIG. 14 is a conceptual diagram of a data position identification system 304 configured to identify the presence of a information data pattern recorded on a magnetic track, in accordance with another embodiment of the present invention. The data position identification system 304 of the embodiment of FIG. 14 is similar to the identification system described above in connection with FIG. 10, in that it includes a read unit 150a, a sense amplifier 200, a position detection unit 300, a temporary storage unit 400, and a controller 500. As in the embodiment of FIG. 13, the read unit 150a is positioned to correspond with a domain location of the magnetic track 100' where data can be read. A difference lies in that the present data position identification system 304 of the embodiment of FIG. 13 has a non-buffered magnetic track arrangement.

Figure 15A:
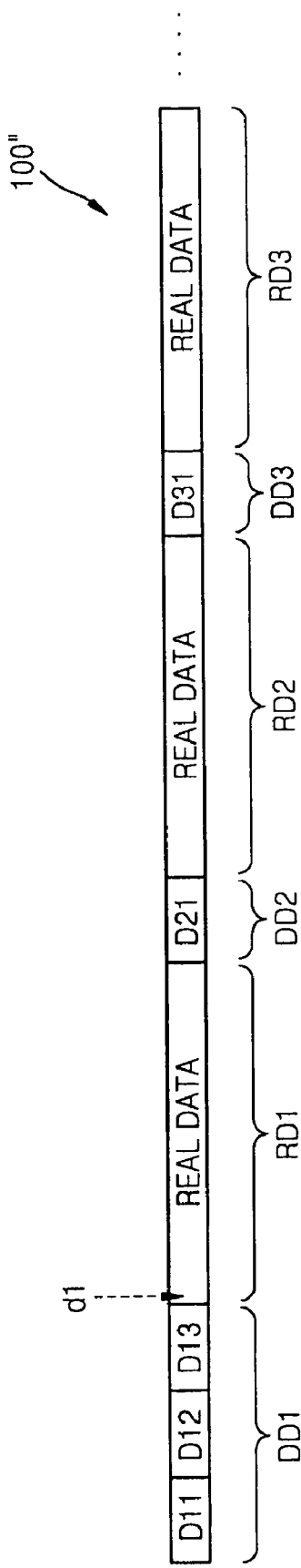
FIGS. 15A and 15B are conceptual diagrams of a data position identification system configured to identify the presence of a information data pattern recorded on a magnetic track, in accordance with another embodiment of the present invention.
Figure 15B:
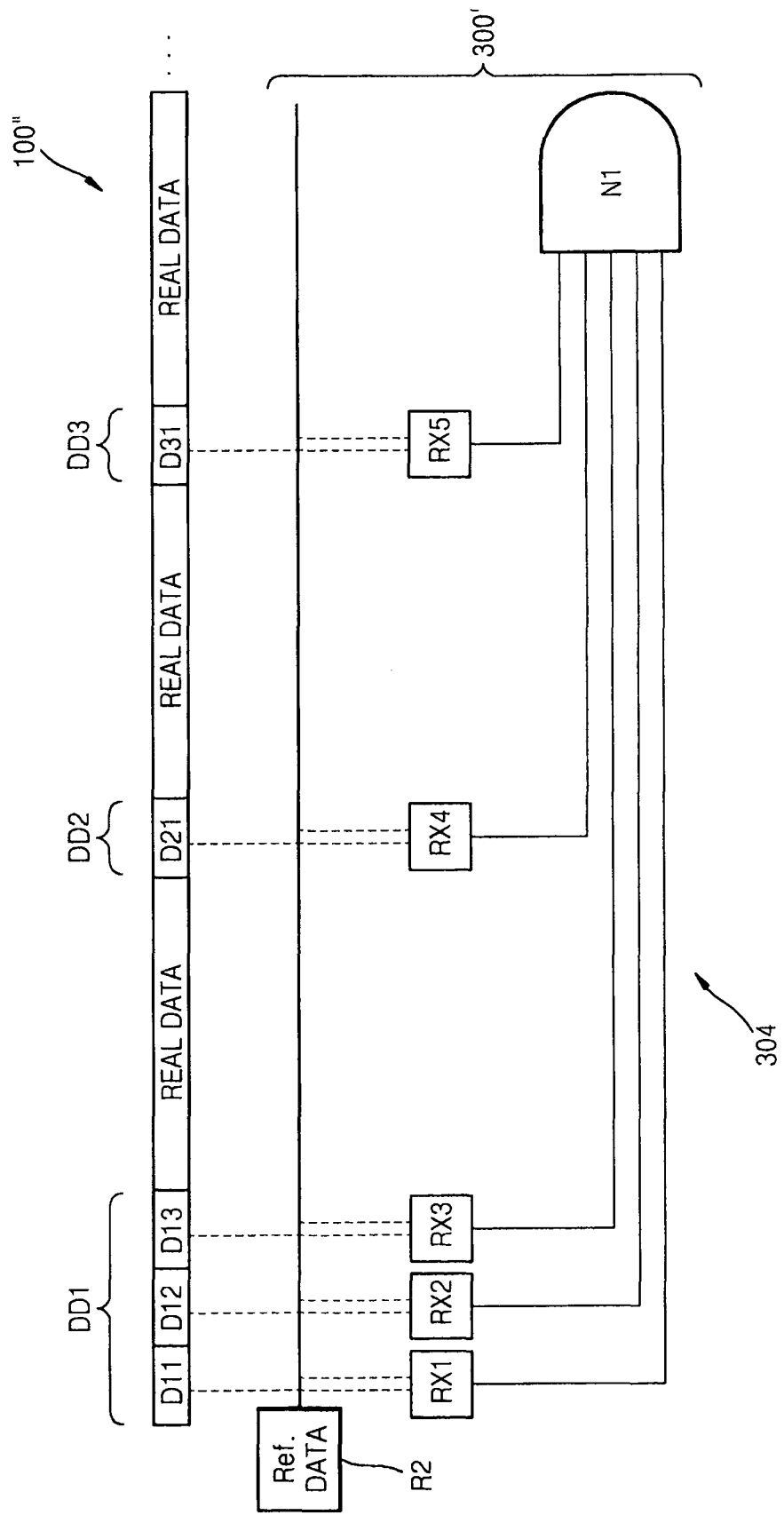

FIGS. 15A and 15B are conceptual diagrams of a data position identification system 304 configured to identify the presence of a information data pattern recorded on a magnetic track, in accordance with another embodiment of the present invention. The embodiment of FIG. 15A depicts a magnetic track 100" whereby the position of a plurality of real data RD1, RD2, RD3 segments are determined based on a plurality of identification data patterns DD1, DD2, DD3. In this example, the position of first real data RD1, for example, first domain position d1 of the first real data RD1, is identified by a first identification data pattern DD1, the first identification data pattern DD1 containing three sub-identification data patterns D11, D12, D13, as described above. In addition, the position of a second real data RD2 is identified by a second identification data pattern DD2, the second identification data pattern DD2 containing one or more, in this case, one, sub-identification data patterns D21. Also, the position of a third real data RD3 is identified by a third identification data pattern DD3, the third identification data pattern DD3 containing one or more, in this case, one, sub-identification data patterns D31. In this configuration, the domain positions of the first, second and third identification data patterns DD1, DD2, DD3 relative to the domain positions of the first, second and third real data patterns RD1, RD2, RD3 are all predetermined. In one embodiment, the spacing, in number of domains, between the first and second identification data patterns DD1, DD2, the second and third identification patterns, DD2, DD3, the third and fourth identification patterns DD3, DD4, etc., is the same, such that the positioning of the identification patterns with regard to the domains on the magnetic track is periodic.

Referring to FIG. 15B, the data position identification system 304 in accordance with this embodiment has a position detecting unit 300' that includes five read units, each read unit positioned to correspond with the position of the first, second and third identification data patterns DD1, DD2, DD3 on the magnetic track 100", and, in the case of the first identification data pattern DD1, with the position of the first, second and third sub-identification data patterns D11, D12, D13 on the magnetic track 100". For example, a first read unit (not shown) reads data from a domain of the magnetic track corresponding to a data element of the first sub-identification data pattern D11 of the first identification data pattern DD1, and places the read data in a first read data register RX1. At the same time, a second read unit (not shown) reads data from a domain of the magnetic track corresponding to a data element of the second sub-identification data pattern D12 of the first identification data pattern DD1, and places the read data in a second read data register RX2. At the same time, a third read unit (not shown) reads data from a domain of the magnetic track corresponding to a data element of the third sub-identification data pattern D13 of the first identification data pattern DD1, and places the read data in a third read data register RX3. At the same time, a fourth read unit (not shown) reads data from a domain of the magnetic track corresponding to a data element of the second identification data pattern DD2, and places the read data in a fourth read data register RX4. At the same time, a fifth read unit (not shown) reads data from a domain of the magnetic track corresponding to a data element of the third identification data pattern DD3, and places the read data in a fifth read data register RX5. The data stored in the first through fifth read data registers RX1 . . . RX5 are compared with corresponding reference data stored in corresponding reference registers R2 as described above in connection with FIGS. 9 and 10. The comparison results are provided to an AND gate N1 as described above to determine whether all five sub-identification data patterns D11, D12, D13, D21, D31 result in a match. In the event of a match, the output of the AND gate N1 of the position detection unit 300" indicates that the positions of the corresponding first, second and third real data RD1, RD2, RD3 are all determined and known and can be read, if desired.

Figure 16:
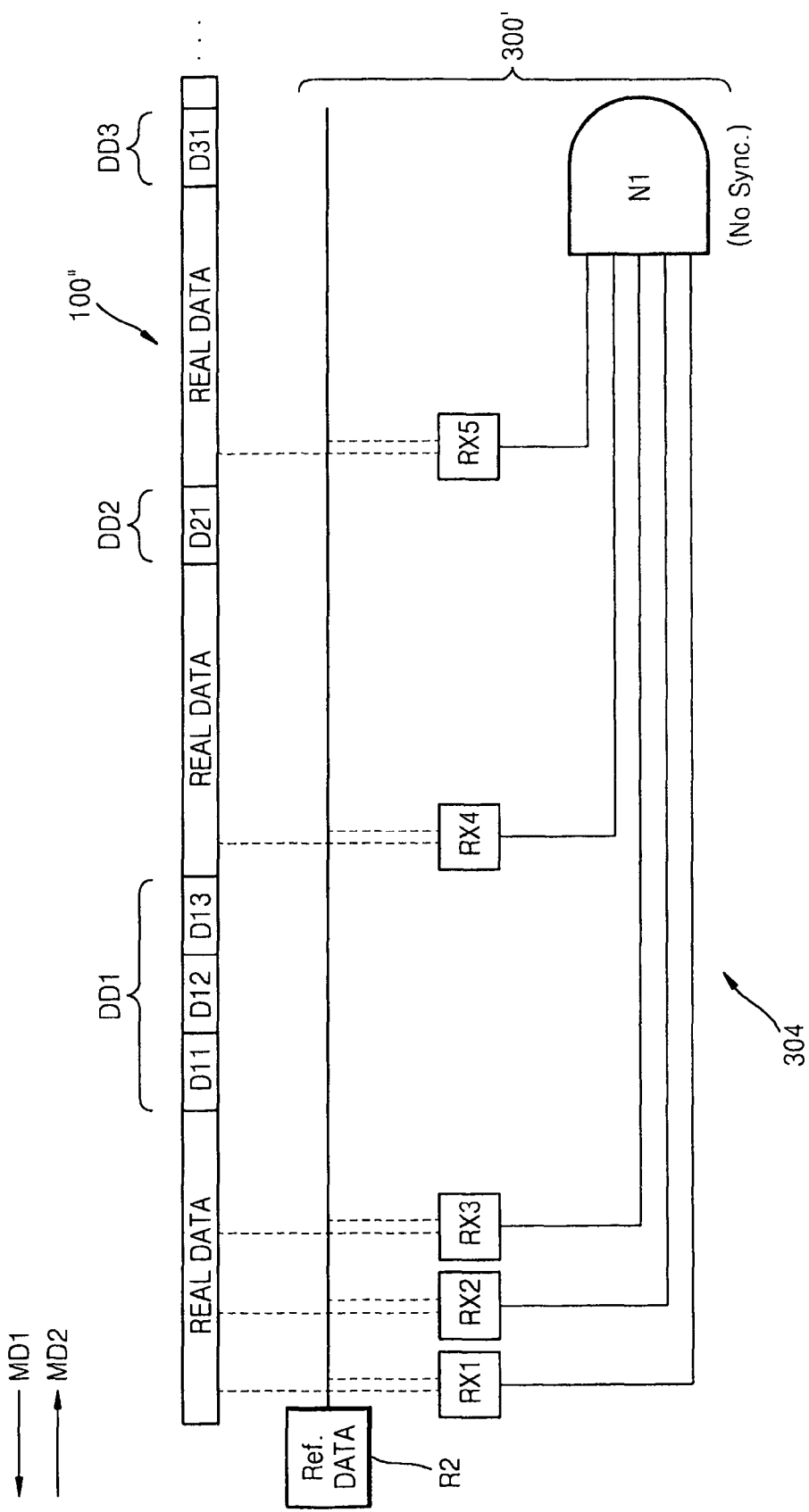
FIGS. 16 and 17 are conceptual diagrams of a data position identification system during a determination of the position of the real data in accordance with another embodiment of the present invention.
Figure 17:
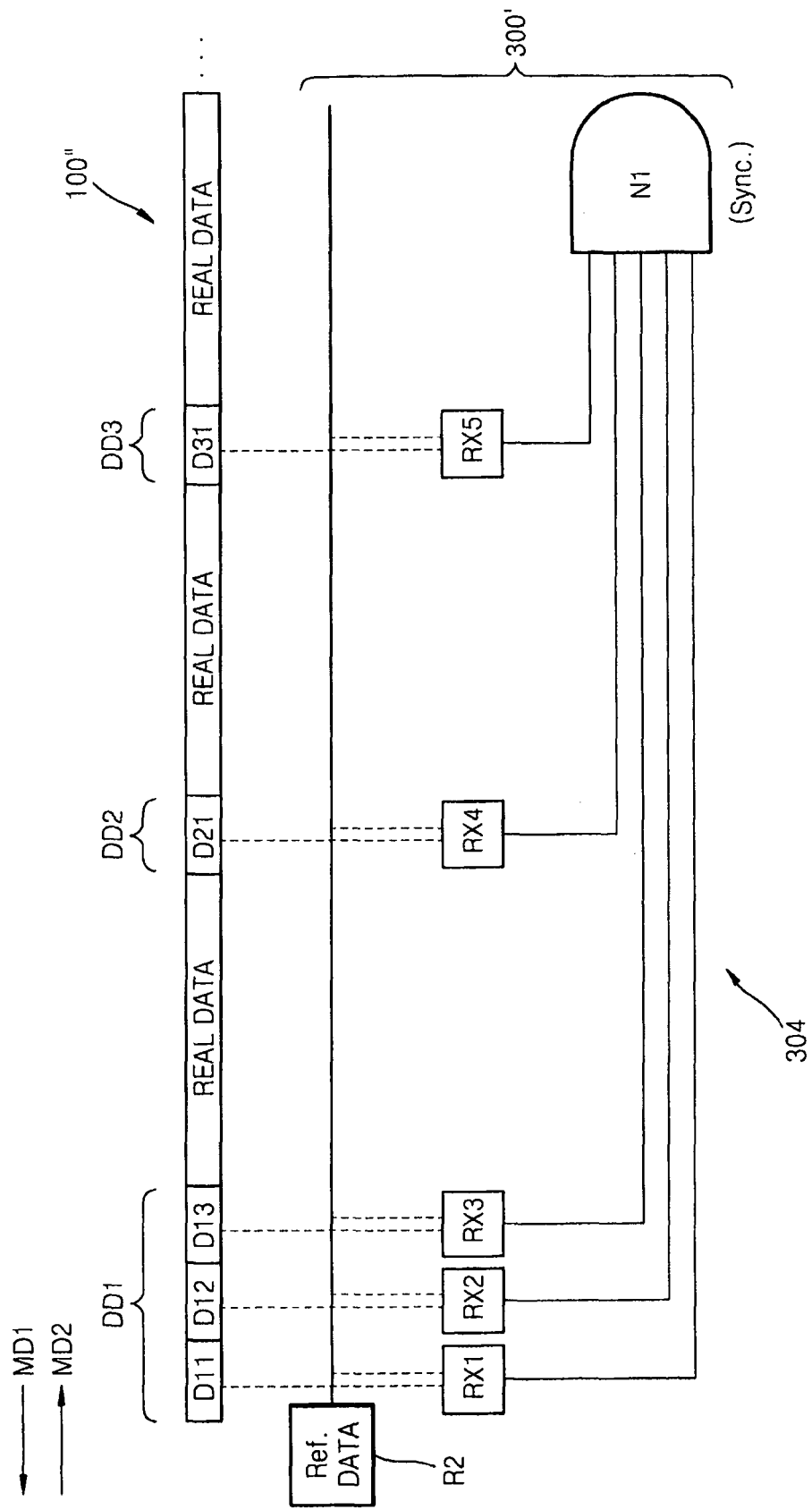

FIGS. 16 and 17 are conceptual diagrams of a data position identification system 304 during a determination of the position of the real data RD1, RD2, RD3, in accordance with another embodiment of the present invention. In this example, it is assumed that the positions of the real data RD1, RD2, RD3 are not yet known, and are desired. Accordingly, a read operation is performed, and, at the time shown in the example of FIG. 16, no match occurs, because the data most recently read is not the data of the five sub-identification data patterns D11, D12, D13, D21, D31. As a result, the contents of the first through fifth data read registers RX1 . . . RX5 does not match the contents of the corresponding reference registers R2, and the output of the AND gate N1 of the position detection unit 300" is inactive. This inactive state indicates a "no match" condition, and therefore, it can be assumed that the position of the real data RD1, RD2, RD3 is not yet known.

Turning to FIG. 17, a number of read operations are assumed to have occurred, causing shifting of the data elements in the MD1 direction of the magnetic track 100". At a point where the five sub-identification data patterns D11, D12, D13, D21, D31 have most recently and simultaneously been read, a match occurs, and the contents of the first through fifth data read registers RX1 . . . RX5 matches the contents of the corresponding reference registers R2. As a result, the output of the AND gate N1 of the position detection unit 300" is active. The active state is an indication that the position of the real data RD1, RD2, RD3 corresponding to the five sub-identification data patterns D11, D12, D13, D21, D31 is known. In an example, where the real data RD1, RD2, RD3 are written to the magnetic track directly adjacent the identification data patterns DD1, DD2, DD3, it can be assumed that the next data elements to be read by the read units are the real data RD1, RD2, RD3.

In the embodiments of FIGS. 15-17, one or more of the read units associated with the first through fifth data read registers RX1 . . . RX5 can be the same read unit that is used to read data from the magnetic track 100" during a read operation, and the data can be read during that read operation from a single read unit or from multiple read units in parallel. In a case where the same read unit is used for both a data position identification operation and a read operation of data, that read unit and the sense amplifier connected to that read unit can be connected to both the position detection unit 300" and the circuitry for processing the read data.

Similarly, in the embodiments of FIGS. 1, 2, 3, 9, 10, 13, and 14 above one or more of the read units 150, 150a associated with the data position identification operation can be the same read unit 150, 150a that is used to read data from the magnetic track 100, 100' during a read operation. In a case where the same read unit 150a, 150a is used for both a data position identification operation and a read operation of data, that read unit 150, 150a and the sense amplifier 200 connected to that read unit 150, 150a can be connected to both the position detection unit 300, 300' and the circuitry for normal processing the read data.

Figure 18:
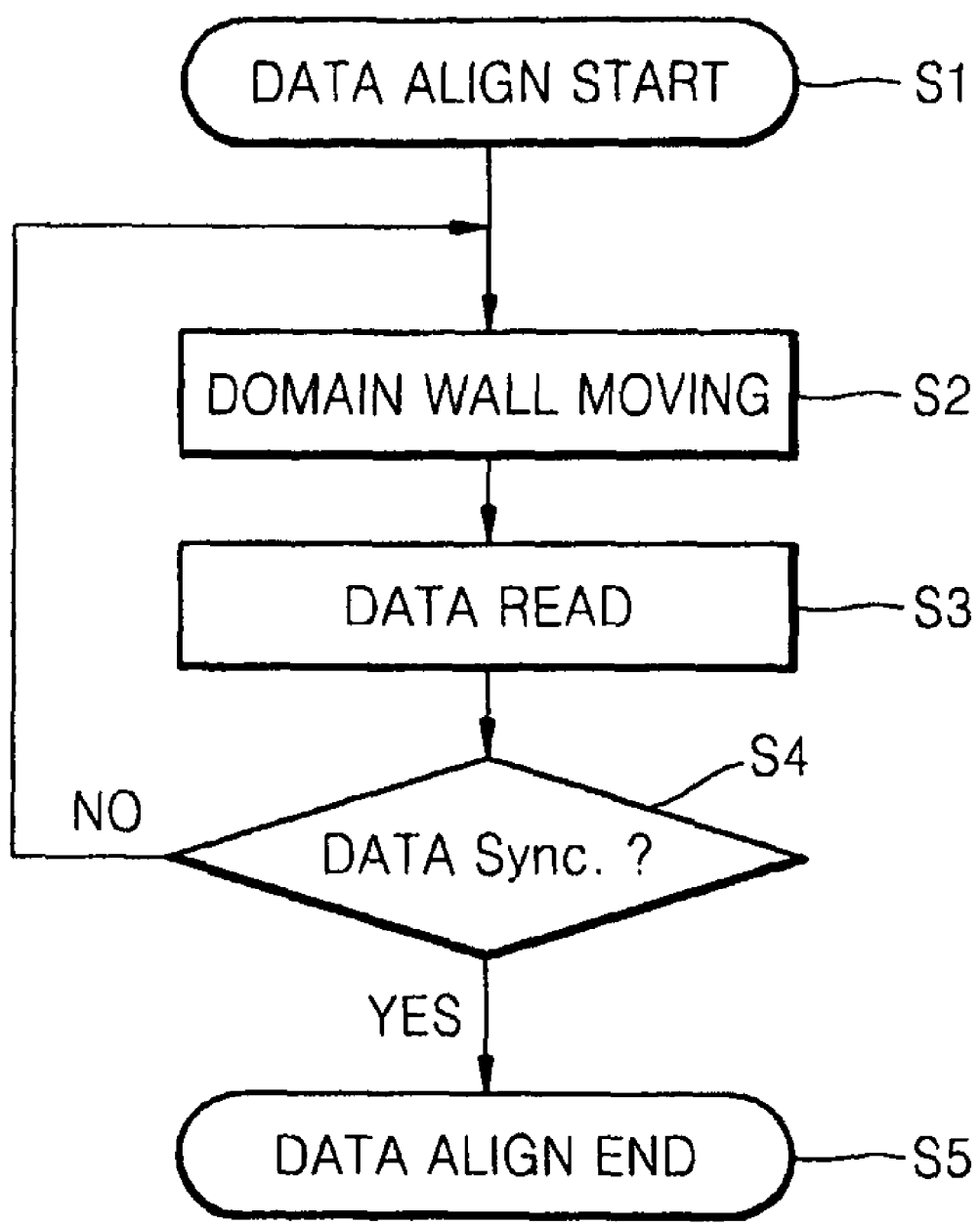
FIG. 18 is a flow diagram of the operation of an identification system configured to identify the presence of a information data pattern recorded on a magnetic track, in accordance with another embodiment of the present invention.

FIG. 18 is a flow diagram of the operation of an identification system configured to identify the presence of a information data pattern recorded on a magnetic track, in accordance with another embodiment of the present invention.

At step S1, a data alignment/identification operation is commenced. In one example, such an operation may be needed after a power failure occurs and the system no longer has access to information related to the last known position of data stored on the magnetic track 100.

At step S2, a domain wall moving operation is performed on the magnetic track to shift the data elements of the respective domains to the left or right, depending on the orientation of the applied domain wall moving current.

At step S3, a data read operation is performed. In the embodiments of FIGS. 9, 10, 13, and 14, the data read operation is performed at a single domain of the magnetic track. In the embodiments of FIGS. 15-17, the data read operation is performed at multiple domains of the magnetic track.

At step S4, the contents of the one or more data read registers are compared with the contents of the one or more reference registers, for example in the manner described above in connection with FIGS. 11 and 12. If the comparison results in non-match, the operation continues at step S2 above. If the comparison results in non-match, the operation proceeds to step S5.

At step S5, the data alignment/identification operation is complete. At this point, the location of real data associated with the identification data patterns is known. The system can then proceed to read the real data at the known domain location on the magnetic track. Alternatively, the system can then perform a write operation to write data to the known domain location on the magnetic track.

Figure 19:
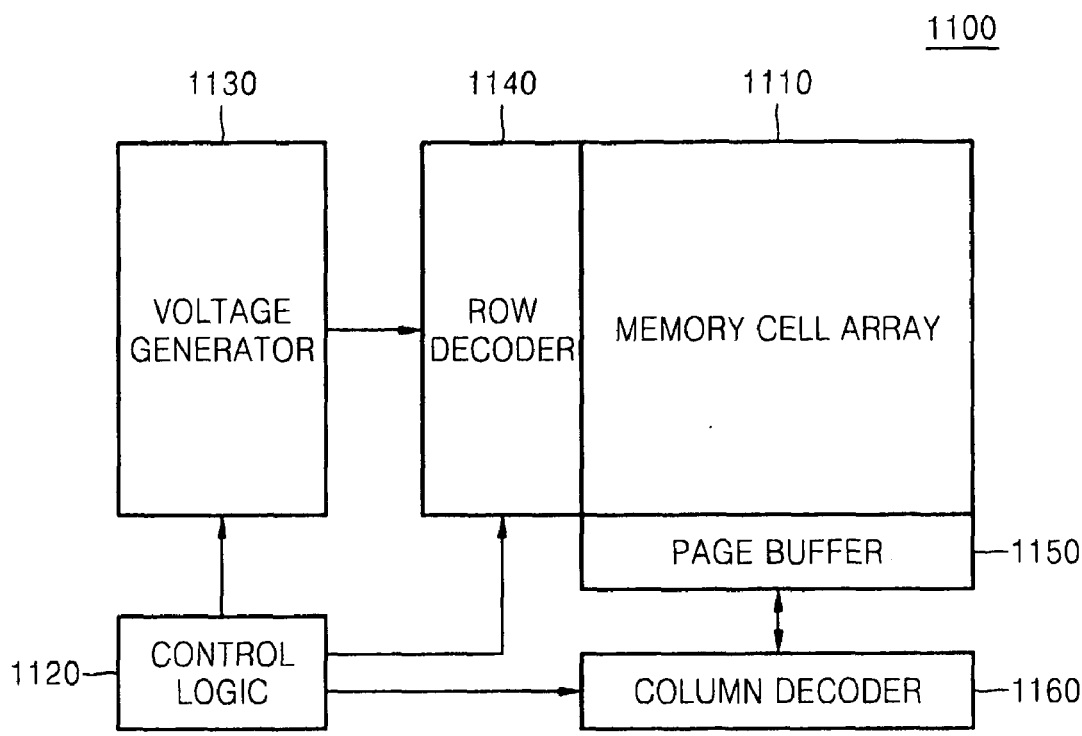
FIG. 19 is a block diagram of a memory device in accordance with embodiments of the present invention.

FIG. 19 is a block diagram of a memory device in accordance with embodiments of the present invention. A memory device 1100 includes a memory cell array 1110, control logic 1120, a voltage generator 1130, a row decoder 1140, a page buffer 1150, and a column decoder 1160. The memory cell array 1110 includes a plurality of magnetic track storage devices of the type described herein, optionally arranged in memory blocks. Control logic 1120 transmits control signals to the voltage generator 1130, the row decoder 1140 and the column decoder 1160 in accordance with the operation to be performed, for example, erase, programming, and read operations. The voltage generator 1130 generates the voltages required for performing the device operations. The row decoder 1140 determines the manner in which the voltage signals provided by the voltage generator are applied to the select lines of the memory cell array 1110. The column decoder determines which signals of the conduction lines BLn of the device read by the page buffer 1150 are to be used in determining data values that are read, or determines voltages that are applied to the conduction lines BLn during programming and erase operations.

Figure 20:
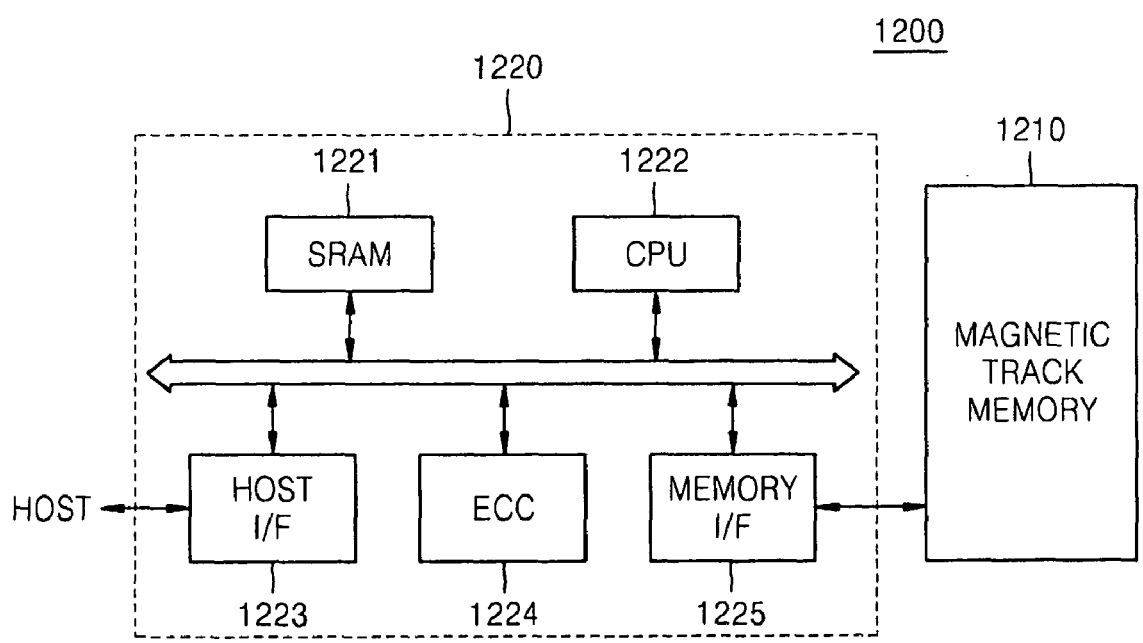
FIG. 20 is a block diagram of a memory card that includes a semiconductor device in accordance with the embodiments of the present invention.

FIG. 20 is a block diagram of a memory card that includes a semiconductor device in accordance with the embodiments of the present invention. The memory card 1200 includes a memory controller 1220 that generates command and address signals C/A and a memory module 1210 that includes one or a plurality of memory devices incorporating magnetic track storage devices of the type described herein. The memory controller 1220 includes a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device includes a plurality of addressable magnetic tracks and a decoder that receives the receives the command and address signals, and that generates a row signal and a column signal for accessing at least one of the addressable locations on the magnetic tracks during programming and read operations. Each of the components of the memory card 1200, including the memory controller 1220, electronics 1221, 1222, 1223, 1224, and 1225 included on the memory controller 1220 and the memory module 1210 can employ memory devices including magnetic track storage devices configured according to the inventive concepts disclosed herein. In various embodiments, the memory controller 1220 can operate to enter into a wait mode while the memory device 1210 is being calibrated, according to the embodiments disclosed herein. In other embodiments, the memory controller 1220 can operate to enter into a calibration mode when a change in operating temperature of a predetermined amount is sensed.

Figure 21:
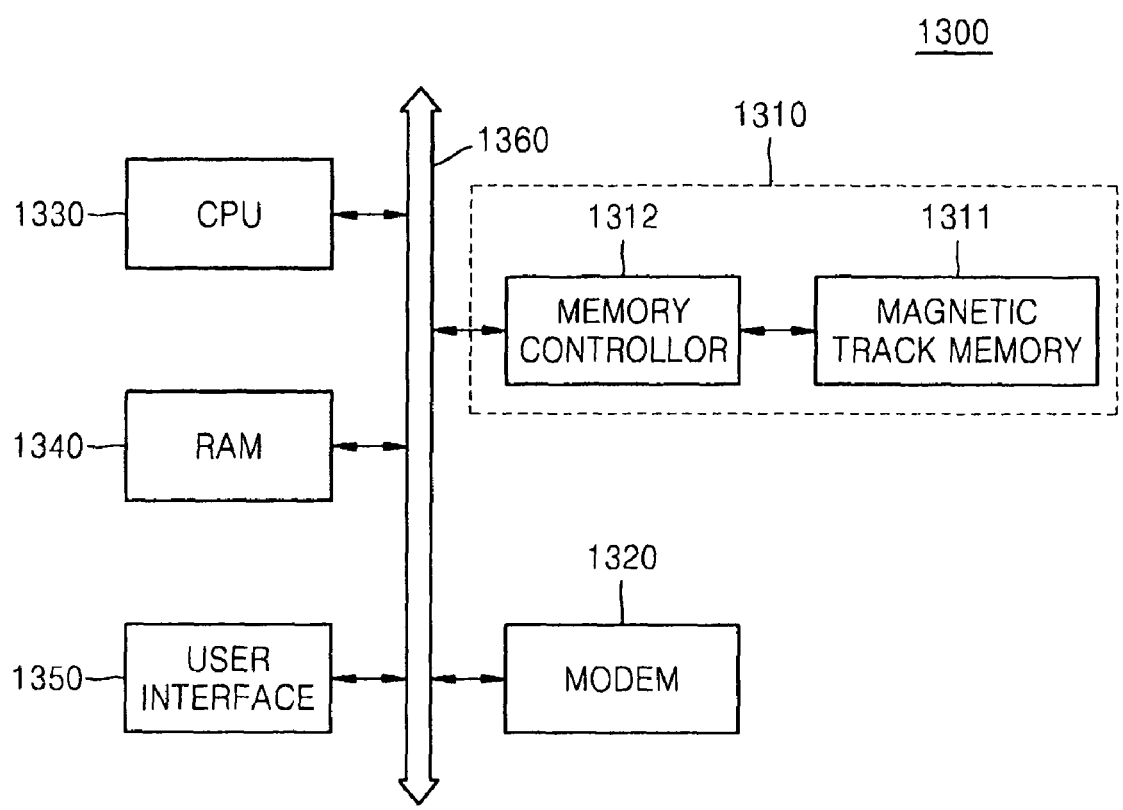
FIG. 21 is a block diagram of a memory system that employs a memory module, for example, of the type described herein, in accordance with the embodiments of the present invention.

FIG. 21 is a block diagram of a memory system 1300 that employs a memory module 1310, for example, of the type described herein, in accordance with the embodiments of the present invention. The memory system 1300 includes a processor 1330, random access memory 1340, user interface 1350 and modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can employ memory devices including magnetic track storage devices of the type disclosed herein. The memory system 1300 can find application in any of a number of electronic applications, for example, those found in consumer electronic devices such as solid state disks (SSD), camera image sensors (CIS) and computer application chip sets. In various embodiments, the memory controller 1312 can operate to enter into a wait mode while the memory device 1311 is being calibrated, according to the embodiments disclosed herein. In other embodiments, the memory controller 1312 can operate to enter into a calibration mode when a change in operating temperature of a predetermined amount is sensed.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

Systems and methods in accordance with embodiments disclosed herein provide a mechanism by which the position of real data stored on a magnetic track can be determined. Such a determination is made without the need for a counter or pointer, which can be complex in nature and therefore would otherwise consume valuable circuit area. Instead, the determination is made using a simplified logic operation that draws a comparison between a read data and a known data identification pattern. Data can be read from a single set of adjacent domains or from multiple sets of adjacent domains of the track in making the comparison. The systems and methods disclosed herein can be applied for example, after a sudden power failure where information pertaining to the position of the real data can be lost.

Systems and methods in accordance with embodiments disclosed herein further provide a mechanism by which an optimal value of the domain wall moving current is determined by storing a calibration data element on the magnetic track and by optimizing the domain wall moving current based on the calibration data element. In one embodiment, the optimal pulse width of the domain wall moving current is determined. In another embodiment, the optimal magnitude of the domain wall moving current is determined. In this manner, efficient and accurate operation of the magnetic track can be ensured, despite variation in fabrication process and in operating conditions.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A memory device, comprising:
   a magnetic structure that stores information in a plurality of domains of the magnetic structure;
   a read unit that reads information from at least one of the plurality of domains of the magnetic structure by applying a read current to the magnetic structure; and
   a position detector unit that compares the information read by a read current from the read unit from multiple domains of the plurality of domains of the magnetic structure to identify the presence of an expected information pattern at select domains of the plurality of domains, wherein the expected information pattern comprises:
   a first pattern;
   a second pattern spaced apart from the first pattern by a number of domains of the plurality of domains of the magnetic structure, and wherein the second pattern comprises a plurality of second patterns that are spaced apart from each other by a number of domains of the plurality of domains of the magnetic structure and wherein the number of domains between each of the plurality of second patterns is the same.

2. The memory device of claim 1 wherein the read unit comprises multiple read units, the read units corresponding to domains that are spaced apart from each other by a number of domains that is approximately equal to the number of domains by which the second pattern is spaced apart from the first pattern.

3. The memory device of claim 1 wherein the second pattern is different than the first pattern.

4. The memory device of claim 1 wherein the first and second patterns comprise a toggling bit pattern of alternating "0" and "1" bits.

5. The memory device of claim 1 wherein the position detector unit comprises logic circuitry that performs a bitwise comparison of the information read by the read unit and the expected information pattern.

6. The memory device of claim 5 wherein the logic circuitry of the position detector unit comprises:
   a read data register that stores information read by the read unit;
   a reference register that stores the expected information pattern; and
   a logic circuit that compares the contents of the read data register and the reference register and that outputs a comparison result.

7. The memory device of claim 6 wherein the logic circuit of the position detector unit comprises:
   a read data register that stores information read by the read unit; and
   a logic circuit that compares the contents of the read data register and the expected information pattern, wherein the expected information pattern comprises a series of hard-wired bits determined during manufacturing, and that outputs a comparison result.

8. The memory device of claim 1 wherein the read unit comprises a single read unit.

9. The memory device of claim 1 wherein the read unit applies the read current in response to a read current control signal, and wherein the magnetic structure further comprises:
   a write unit that writes information to at least one of a plurality of domains of the magnetic structure by applying a write current to the magnetic structure in response to a write current control signal; and
   a domain wall movement control unit coupled to a portion of the magnetic structure that moves information stored in the plurality of domains in the magnetic structure to other domains in the magnetic structure in response to a domain wall movement control signal.

10. The memory device of claim 9 wherein the write unit and read unit are coupled to portions of the magnetic structure at domain positions that are at central regions of the magnetic structure.

11. The memory device of claim 9 wherein the write unit and read unit are coupled to portions of the magnetic structure at domain positions that are spaced apart from each other at opposite ends of the magnetic structure.

12. The memory device of claim 1 further comprising:
   a memory decoder that generates a plurality of select signals in response to command and address signals received from a memory controller and that applies the select signals to selected signal lines; and a read current generator that applies the read current to the read unit, wherein the read unit reads information by applying the read current to the magnetic structure on the read current signal line in response to the select signal on a corresponding selected signal line.

13. A method of controlling a memory device comprising a magnetic structure that stores information in a plurality of domains of the magnetic structure, the method comprising:
   reading information from at least one of the plurality of domains of the magnetic structure by applying a read current to the magnetic structure at a read unit; and
   comparing the information read by the read unit from multiple domains of the plurality of domains of the magnetic structure to identify the presence of an expected information pattern at select domains of the plurality of domains;
   wherein identifying the presence of the expected information pattern comprises:
   identifying a first pattern; and
   identifying a second pattern spaced apart from the first pattern by a number of domains of the plurality of domains of the magnetic structure;
   wherein the second pattern comprises a plurality of second patterns that are spaced apart from each other by a number of domains of the plurality of domains of the magnetic structure and wherein the number of domains of spacing between each of the plurality of second patterns is the same.

14. The method of claim 13 wherein reading information includes reading information from multiple read units, the read units corresponding to domains that are spaced apart from each other by a number of domains that is similar to the number of domains by which the second pattern is spaced apart from the first pattern.

15. The method of claim 13 wherein the second pattern is different than the first pattern.

16. The method of claim 13 wherein the first and second patterns comprise a toggling bit pattern of alternating "0" and "1" bits.

17. A memory device, comprising:
   a magnetic structure that stores information in a plurality of domains of the magnetic structure;
   a read unit that reads information from at least one of the plurality of domains of the magnetic structure by applying a read current to the magnetic structure; and
   a position detector unit that compares the information read by a read current from the read unit from multiple domains of the plurality of domains of the magnetic structure to identify the presence of an expected information pattern at select domains of the plurality of domains,
   wherein the position detector unit comprises logic circuitry that performs a bitwise comparison of the information read by the read unit and the expected information pattern.

18. The memory device of claim 17 wherein the logic circuitry of the position detector unit comprises:
   a read data register that stores information read by the read unit;
   a reference register that stores the expected information pattern; and
   a logic circuit that compares the contents of the read data register and the reference register and that outputs a comparison result.

19. The memory device of claim 18 wherein the logic circuit of the position detector unit comprises:
   a read data register that stores information read by the read unit; and
   a logic circuit that compares the contents of the read data register and the expected information pattern, wherein the expected information pattern comprises a series of hard-wired bits determined during manufacturing, and that outputs a comparison result.

* * * * *